(12) United States Patent
Oh et al.

(10) Patent No.: US 7,907,104 B2
(45) Date of Patent: Mar. 15, 2011

(54) LUMINESCENT DISPLAY DEVICE AND METHOD THAT DRIVES THE SAME

(75) Inventors: Du Hwan Oh, Gyeongsangbuk-do (KR); Young Ju Park, Gyengsangnam-do (KR); Hoon Ju Chung, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1029 days.

(21) Appl. No.: 11/472,841

(22) Filed: Jun. 22, 2006

(65) Prior Publication Data

US 2007/0075954 A1   Apr. 5, 2007

(30) Foreign Application Priority Data

Sep. 30, 2005   (KR) .................. 10-2005-0092261

(51) Int. Cl.
*G09C 3/30*   (2006.01)
*G09C 3/10*   (2006.01)
*G11C 19/00*  (2006.01)
(52) U.S. Cl. ............ 345/76; 377/64; 377/79; 315/169.3
(58) Field of Classification Search .............. 345/76; 377/64, 79; 315/169.3
See application file for complete search history.

(56) References Cited

U.S. PATENT DOCUMENTS

| | | | | |
|---|---|---|---|---|
| 5,434,899 | A * | 7/1995 | Huq et al. ........................ 377/78 |
| 6,091,393 | A * | 7/2000 | Park .............................. 345/100 |
| 6,552,709 | B1 * | 4/2003 | Yamaguchi ...................... 345/99 |
| 2004/0041525 | A1 * | 3/2004 | Park et al. ................... 315/169.3 |
| 2005/0057191 | A1 * | 3/2005 | Jo et al. .......................... 315/291 |

* cited by examiner

*Primary Examiner* — Amr Awad
*Assistant Examiner* — Jonathan Boyd
(74) *Attorney, Agent, or Firm* — Brinks Hofer Gilson & Lione

(57) ABSTRACT

A luminescent display device and a method for driving the same are disclosed which are capable of increasing the aspect ratio of pixel regions. The luminescent display device includes a display including gate lines, and data lines extending orthogonally to the gate lines, a first shift register connected to one end of each of the gate lines, to sequentially supply first scan pulses to the gate lines, respectively, a second shift register connected to the other end of each of the gate lines, to sequentially supply second scan pulses to the gate lines, respectively, switching elements each adapted to switch an ON voltage or an OFF voltage from the associated data line in accordance with the first scan pulse from the associated gate line, and to switch an OFF voltage from the associated data line in accordance with the second scan pulse from the associated gate line, drive switching elements each adapted to generate current in accordance with the ON voltage from the associated switching element, each drive switching element being turned off in accordance with the OFF voltage from the associated switching element, capacitors each connected between gate and source terminals of an associated one of the drive switching elements, and light emitting elements each adapted to emit light in accordance with the current from the associated drive switching element.

27 Claims, 12 Drawing Sheets

LUMINESCENT DISPLAY DEVICE AND METHOD THAT DRIVES THE SAME

This application claims the benefit of the Korean Patent Application No. P2005-0092261, filed in Korea on Sep. 30, 2005, which is hereby incorporated by reference as if fully set forth herein.

BACKGROUND

1. Field

A luminescent display device and a method that drives the same is provided.

2. Related Art

Various flat panel display devices have been developed that can eliminate disadvantages of cathode ray tubes caused by bulky and heavy structures thereof. The flat panel display devices includes a liquid crystal display, a field emission display, a plasma display panel, and an electro-luminescent display.

Recently there has been a desire to develop flat panel display devices having a large screen size and a high display quality. These flat panel devices have an electro-luminescent display device which is a self-luminous device. The electro-luminescent display device displays a video image by exciting a fluorescent material using carriers such as electrons or holes. Electro-luminescent display devices are mainly classified into an inorganic electro-luminescent display device and a luminescent display device. The luminescent display device can be driven by a low DC voltage, as compared to the inorganic electro-luminescent display device, because the luminescent display device can be driven by a low voltage of about 5 to 20 V, whereas the inorganic electro-luminescent display device requires a high voltage of 100 to 200 V. The luminescent display device has excellent characteristics such as a high viewing angle, a high response time, and a high contrast ratio. Accordingly, the luminescent display device can be used for a graphic display, a TV image display, or a surface light source. The luminescent display device is thin and light, and exhibits an excellent color display quality. The luminescent display device is suitable for a flat panel display device.

A driving system of such a luminescent display device includes a passive matrix type driving system is mainly used that does not use a separate thin film transistor.

The passive matrix type driving system has many limitative factors associated with resolution, power consumption, and life span. Research and development of active matrix type electro-luminescent display devices have also been conducted, in order to provide a display device having a high resolution and a large screen size.

FIG. 1 is a circuit diagram that illustrates a basic pixel structure of a conventional active matrix type luminescent display device.

As shown in FIG. 1, the basic pixel structure of the conventional active matrix type luminescent display device includes first and second gate lines GL1 and GL2 that extend in parallel in one direction, a data line DL that extends in a direction orthogonal to the first and second gate lines GL1 and GL2, and a pixel cell PXL that is formed in a pixel region defined by the first gate line GL1 and the data line DL.

The pixel cell PXL includes a light emitting element OLED that emits light when current flows through the light emitting element OLED. A first switching element Tr11 switches a data voltage supplied from the data line DL, in response to a first scan pulse supplied from the first gate line GL1. A drive switching element Tr13 generates current corresponding to the data voltage output from the first switching element Tr11, in response to the output data voltage. The drive switching element Tr13 supplies the generated current to the light emitting element OLED. The pixel cell PXL also includes a capacitor C that is connected between gate and source terminals of the drive switching element Tr13, and a second switching element Tr12 that short-circuits the gate and source terminals of the drive switching element Tr13, in response to a second scan pulse supplied from the second gate line GL2.

The source terminal of the drive switching element TrD is connected to a voltage supply line 15 that supplies a drive voltage Vd. The light emitting element OLED is grounded at a cathode electrode thereof.

Operation of the conventional luminescent display device that has the above-mentioned pixel cell PXL will be described in detail.

When the first scan pulse is supplied to the first gate line GL1, the first switching element Tr11 supplies the data voltage from the data line DL to the gate terminal of the drive switching element Tr13. The data voltage has a constant level. Accordingly, the data voltage is stored in the capacitor C. By virtue of the data voltage stored in the capacitor C, the drive switching element Tr13 is turned on, and is maintained in an ON state.

The drive switching element Tr13 generates current that corresponds to the data voltage applied thereto. Since the data voltage has a constant level, the current that corresponds to the data voltage is also constant in amount. Accordingly, the light emitting element OLED, which receives the current generated from the drive switching element Tr13, emits light at a constant brightness.

When the second scan signal is subsequently supplied to the second gate line GL2, the second switching element Tr12 short-circuits the gate and source terminals of the drive switching element Tr13. The gate and source terminals of the drive switching element Tr13 are maintained at the same potential, thereby causing the drive switching element Tr13 to be turned off.

The conventional luminescent display device, which operates as mentioned above, exhibits brightness that varies depending on the light emission time of the light emitting element OLED. The light emitting element OLED emits light for a period of time from the point of time when the first scan pulse is applied to the point of time when the second scan pulse is applied.

For the above-mentioned driving operation, the conventional luminescent display device further includes a first shift register that outputs the first scan pulse, and a second shift register that outputs the second scan pulse.

The first shift register is connected to the first gate line GL1, whereas the second shift register is connected to the second gate line GL2.

The conventional luminescent display device has a problem of a reduction in the aspect ratio of pixel regions because three switching elements Tr11, Tr12, and Tr13 are used.

SUMMARY

A luminescent display device and a method that drives the same is provided.

A luminescent display device comprises a display that includes a plurality of gate lines and a plurality of data lines that extend orthogonally to the gate lines. A first shift register is connected to one end of each of the gate lines, and adapted to sequentially supply first scan pulses to the gate lines, respectively. A second shift register is connected to the other end of each of the gate lines, and adapted to sequentially supply second scan pulses to the gate lines, respectively.

Switching elements are adapted to switch an ON voltage or an OFF voltage from an associated one of the data lines in accordance with the first scan pulse from an associated one of the gate lines, and to switch an OFF voltage from the associated data line in accordance with the second scan pulse from the associated gate line. Drive switching elements are adapted to generate current in accordance with the ON voltage from an associated one of the switching elements, each of the driving switching elements being turned off in accordance with the OFF voltage from the associated switching element. Capacitors are connected between gate and source terminals of an associated one of the drive switching elements. Light emitting elements are adapted to emit light in accordance with the current from an associated one of the drive switching elements.

In another aspect of the present invention, a method that drives a luminescent display device includes a display that includes a plurality of gate lines and a plurality of data lines that extend orthogonally to the gate lines. Switching elements each adapted to switch an ON voltage or an OFF voltage from an associated one of the data lines in accordance with a scan pulse from an associated one of the gate lines, and to switch an OFF voltage from the associated data line in accordance with the second scan pulse from the associated gate line. Drive switching elements supply current in accordance with the ON voltage from an associated one of the switching elements, and cutt off the supply of current in accordance with the OFF voltage from the associated switching element. Light emitting elements each adapted to emit light in accordance with the current from an associated one of the drive switching element. The method comprises the acts of: supplying a first scan pulse to each of the gate lines, thereby primarily turning on the switching element associated with the gate line; supplying the ON voltage to the data line associated with the gate line; supplying a second scan pulse to the gate line, thereby secondarily turning on the associated switching element; and supplying the OFF voltage to the associated data line.

It is to be understood that both the foregoing general description and the following detailed description are exemplary and explanatory and are intended to provide further explanation of the embodiments as claimed.

BRIEF DESCRIPTION OF THE DRAWINGS

The accompanying drawings, which are included to provide a further understanding of the embodiments as claimed and are incorporated in and constitute a part of this application, illustrate embodiment(s) that serve to explain the principle of the invention. In the drawings:

DESCRIPTION

Reference will now be made in detail to the preferred embodiments, examples of which are illustrated in the accompanying drawings. Wherever possible, the same reference numbers will be used throughout the drawings to refer to the same or like parts.

Figure 1:
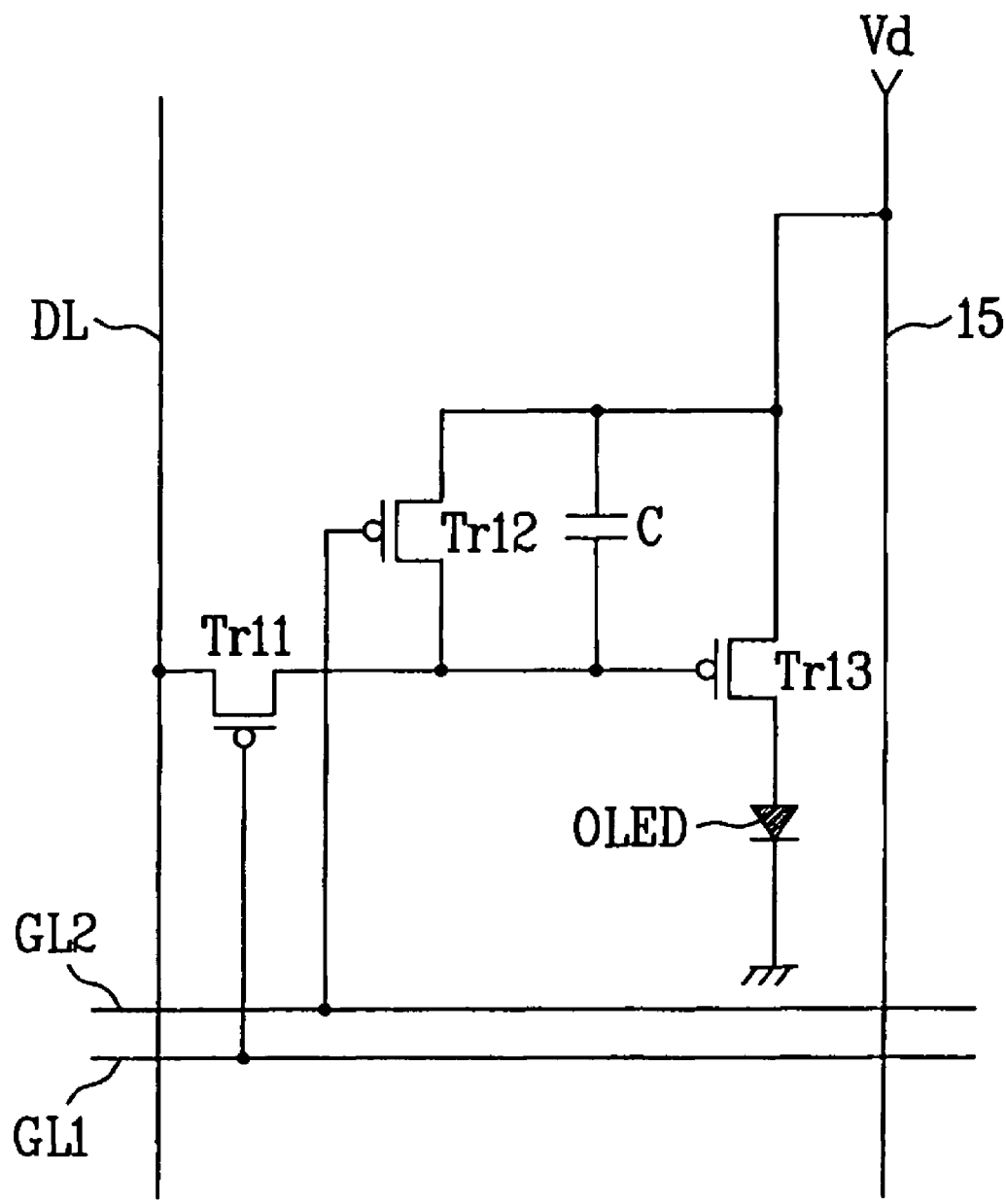
FIG. 1 is a circuit diagram that illustrates a basic pixel structure of a conventional active matrix type luminescent display device.
Figure 2:
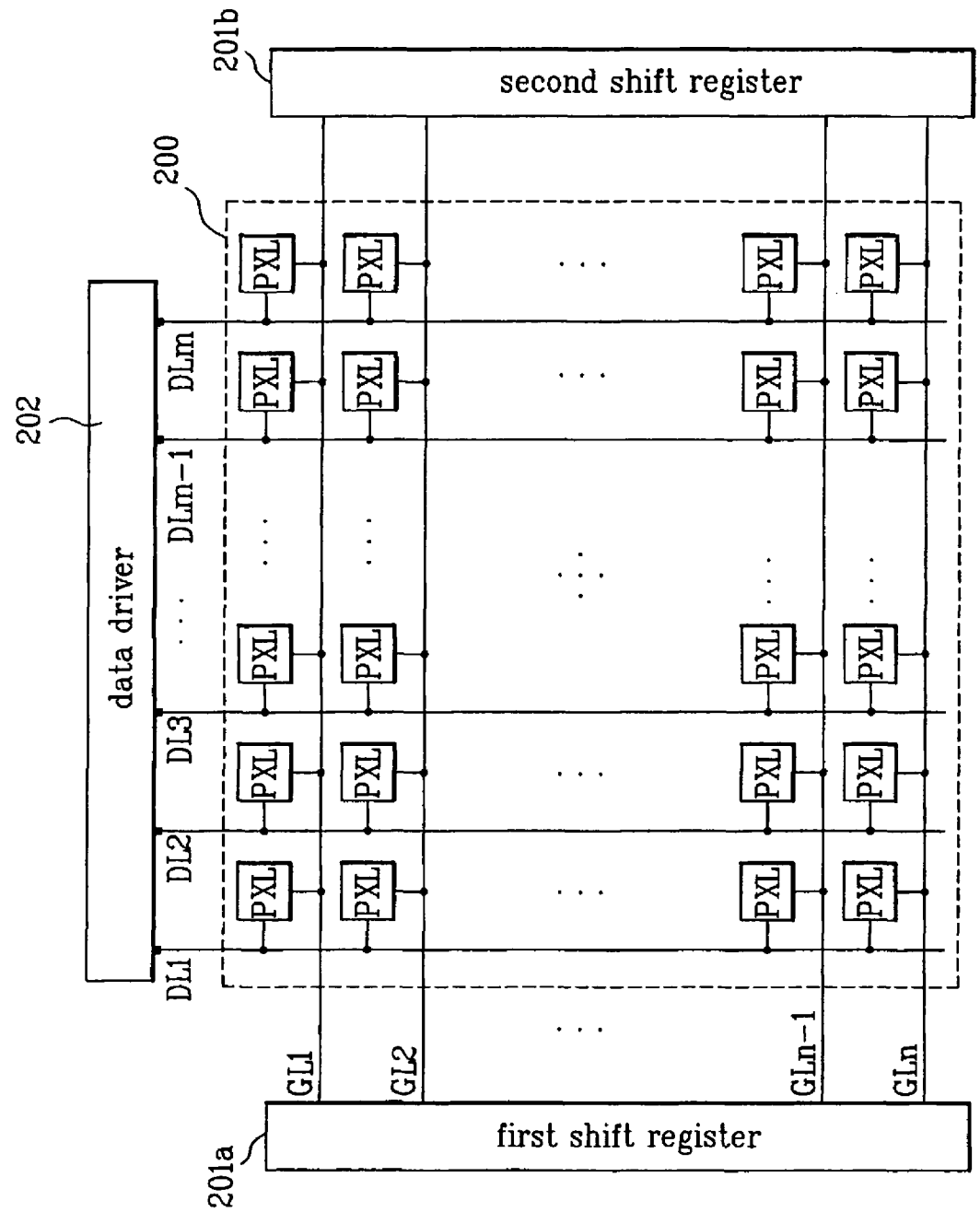
FIG. 2 is a block diagram that illustrates a luminescent display device.

FIG. 2 is a block diagram that illustrates a luminescent display device according to an exemplary embodiment.

As shown in FIG. 2, the luminescent display device according to the illustrated exemplary embodiment includes a display 200 that displays an image. A data driver 202 supplies a data signal to the display 200. A first shift register 201a supplies a plurality of first scan pulses to the display 200. A second shift register 201b supplies a plurality of second scan pulses to the display 200.

The display 200 includes a plurality of gate lines GL1 to GLn that extend in parallel in one direction. A plurality of data lines DL1 to DLm extend in parallel in a direction orthogonal to the gate lines GL1 to GLn. Pixel cells PXL that are respectively formed in pixel regions are defined by an associated one of the gate lines GL1 to GLn and an associated one of the data lines DL1 to DLm.

Figure 3:
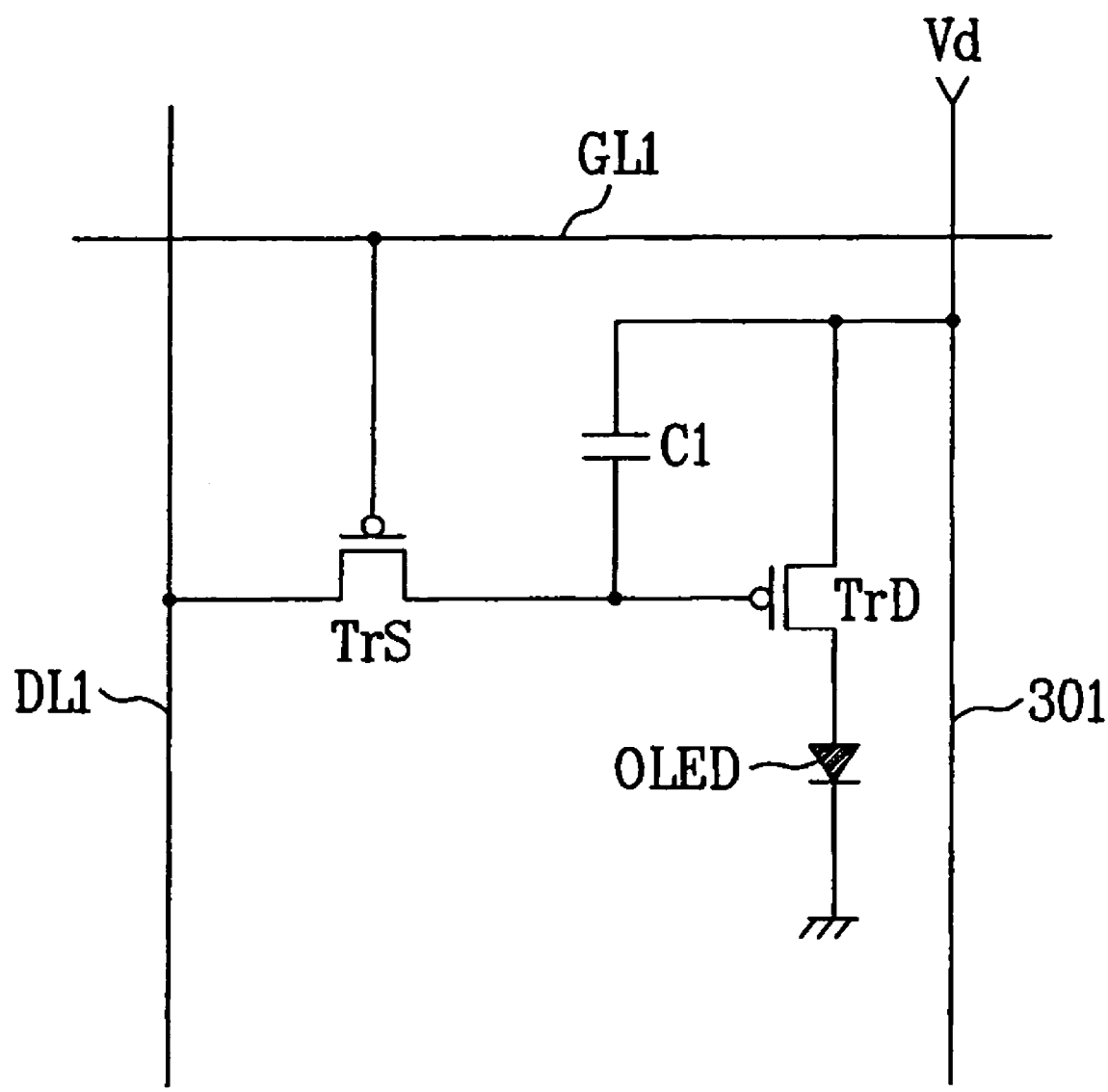
FIG. 3 is a circuit diagram of each pixel cell shown in FIG. 2.

FIG. 3 is a circuit diagram of each pixel cell.

As shown in FIG. 3, each pixel cell PXL includes a switching element TrS, a drive switching element TrD, a capacitor C1, and a light emitting element OLED.

The switching element TrS is turned on when it receives a first scan pulse output from the first shift register 201a via an associated one of the gate lines GL1 to GLn, for example, the gate line GL1. In an ON state thereof, the switching element TrS subsequently receives a data signal output from the data driver 202 via an associated one of the data lines DL1 to DLm, for example, the data line DL1. The switching element TrS is connected, at a gate terminal thereof, to the associated gate line GL1, and is connected, at a source terminal thereof, to the associated data line D1, and is connected, at a drain terminal thereof, to a gate terminal of the drive switching element TrD.

The data signal is a digital data signal that has a digital code of "0" or "1". The digital code of "0" has a voltage value set to an OFF voltage that turns off the drive switching element TrD. The digital code of "1" has a voltage value set to an ON voltage that turns on the drive switching element TrD.

The drive switching element TrD is turned on in accordance with the ON voltage of the data signal supplied from the switching element TrS, thereby establishing a current path between the drive voltage source and the light emitting element OLED. In response to the ON voltage, the drive switching element TrD generates current that corresponds to a voltage supplied from the drive voltage source, for example, a drive voltage Vd, and supplies the current to the light emitting element OLED. By virtue of the current, the light emitting element OLED emits light. The drive switching element TrD is connected, at the gate terminal thereof, to the drain terminal of the switching element TrS. The source terminal thereof is connected to a power line 301 that transmits the drive voltage Vd. The drain terminal thereof is connected to an anode terminal of the light emitting element OLED. The light emitting element OLED is also grounded at a cathode terminal thereof.

The switching element TrS is also turned on in response to the second scan pulse supplied from the second shift register 201b. In an ON state thereof, the switching element TrS subsequently receives an OFF voltage output from the data driver 202. In accordance with the OFF voltage, the drive switching element TrD is turned off, thereby causing the current path between the drive voltage source and the light emitting element OLED to be cut off. The current from the drive switching element TrD is prevented from flowing through the light emitting element OLED and the light emission of the light emitting element OLED is stopped.

The capacitor C1 is connected between the gate and source terminals of the drive switching element TrD, in order to maintain the ON voltage or OFF voltage supplied to the drive switching element TrD for one subfield.

The second scan pulse is output after a predetermined time elapses from the point of time when the first scan pulse is output. The period of time between the point of time when the first scan pulse is output and the point of time when the second scan pulse is output corresponds to one subfield period. Each pixel cell PXL repeatedly emits or stops emission of light for a plurality of subfield periods, to express various gray scales.

A frame consists of a plurality of subfields. The number of subfields in one frame corresponds to the number of bits in a data signal associated with the frame. The subfields in each frame have different lengths.

For example, when a data signal having a 4-bit digital code of "1001" is input to one of the data lines DL1 to DLm, the associated pixel cell PXL displays a unit image for 4 subfield periods. It is assumed that the 4 bits of the data signal are supplied to the associated one of the data lines DL1 to DLm in the order from the least significant bit to the most significant bit. Whenever the first scan pulse is supplied, the pixel cell PXL receives an ON voltage or an OFF voltage in accordance with the logic value of an associated one of the bits of the data signal.

In other words, at a start point of a first subfield period, the switching element TrS of the pixel cell PXL is turned on in accordance with the first scan signal supplied from an associated one of the gate lines GL1 to GLn. The switching element TrS is turned off after a predetermined time. The turned-on switching element TrS supplies an ON voltage from the associated data line (the least significant bit of the data signal) to the drive switching element TrD. The drive switching element TrD is turned on in accordance with the ON voltage, thereby generating current. The current from the drive switching element TrD is supplied to the light emitting element OLED.

At an end point of the first subfield period, the switching element TrS of the pixel cell PXL is turned on in accordance with the second scan signal supplied from the associated one of the gate lines GL1 to GLn. The switching element TrS is turned off after a predetermined time. The turned-on switching element TrS supplies an OFF voltage from the associated data line to the drive switching element TrD. The drive switching element TrD is turned off in accordance with the OFF voltage, thereby cutting off the current supplied to the light emitting element OLED. Thus, the light emitting element OLED of the pixel cell PXL emits light for the first subfield period.

The switching element TrS of the pixel cell PXL is turned on at a start point of a second subfield period in accordance with the first scan signal supplied from the associated gate line. The switching element TrS is turned off after a predetermined time. The turned-on switching element TrS supplies an OFF voltage from the associated one of the data lines DL1 to DLm (a first intermediate bit of the data signal) to the drive switching element TrD. As a result, the drive switching element TrD is turned off in accordance with the OFF voltage, and thus the light emitting element OLED is prevented from emitting light.

The switching element TrS of the pixel cell PXL is turned on at an end point of the second subfield period, in accordance with the second scan signal supplied from the associated gate line. The switching element TrS is turned off after a predetermined time. The turned-on switching element TrS supplies an OFF voltage from the associated data line to the drive switching element TrD. The drive switching element TrD is turned off in accordance with the OFF voltage. Thus, the light emitting element OLED of the pixel cell PXL is maintained in an OFF state for the second subfield period.

During a third subfield period, the light emitting element OLED is maintained in an OFF state because the data signal supplied for the third subfield period has an OFF voltage level. During a fourth subfield period, the light emitting element OLED emits light because the data signal supplied for the fourth subfield period has an ON voltage level.

During one frame period, the pixel cell PXL performs emission of light two times, and stops emission of light two times in accordance with the data signal having the digital code of "1001". More specifically, the pixel cell PXL emits light for the first and fourth subfield periods, and stops emission of light for the second and third subfield periods.

The subfield periods have different lengths such that each subfield period is longer than those less significant than the subfield period. The fourth subfield period is longer than the third subfield period. The third subfield period is longer than the second subfield period. The second subfield period is longer than the first subfield period.

Even when data signals have the same numbers of "1" and "0", they may express different gray scales. For example, although the above-described data signal, which has the digital code of "1001", has the same numbers of "1" and "0" as a digital signal having a digital code of "1010", they express different gray scales for the above-described reason.

Thus, the luminescent display device adjusts the brightness of an image by adjusting the light emission time for each frame of the image in accordance with an associated data signal.

During the above-described operations, the first and second shift registers 201a and 201b have the following configurations.

Figure 4:
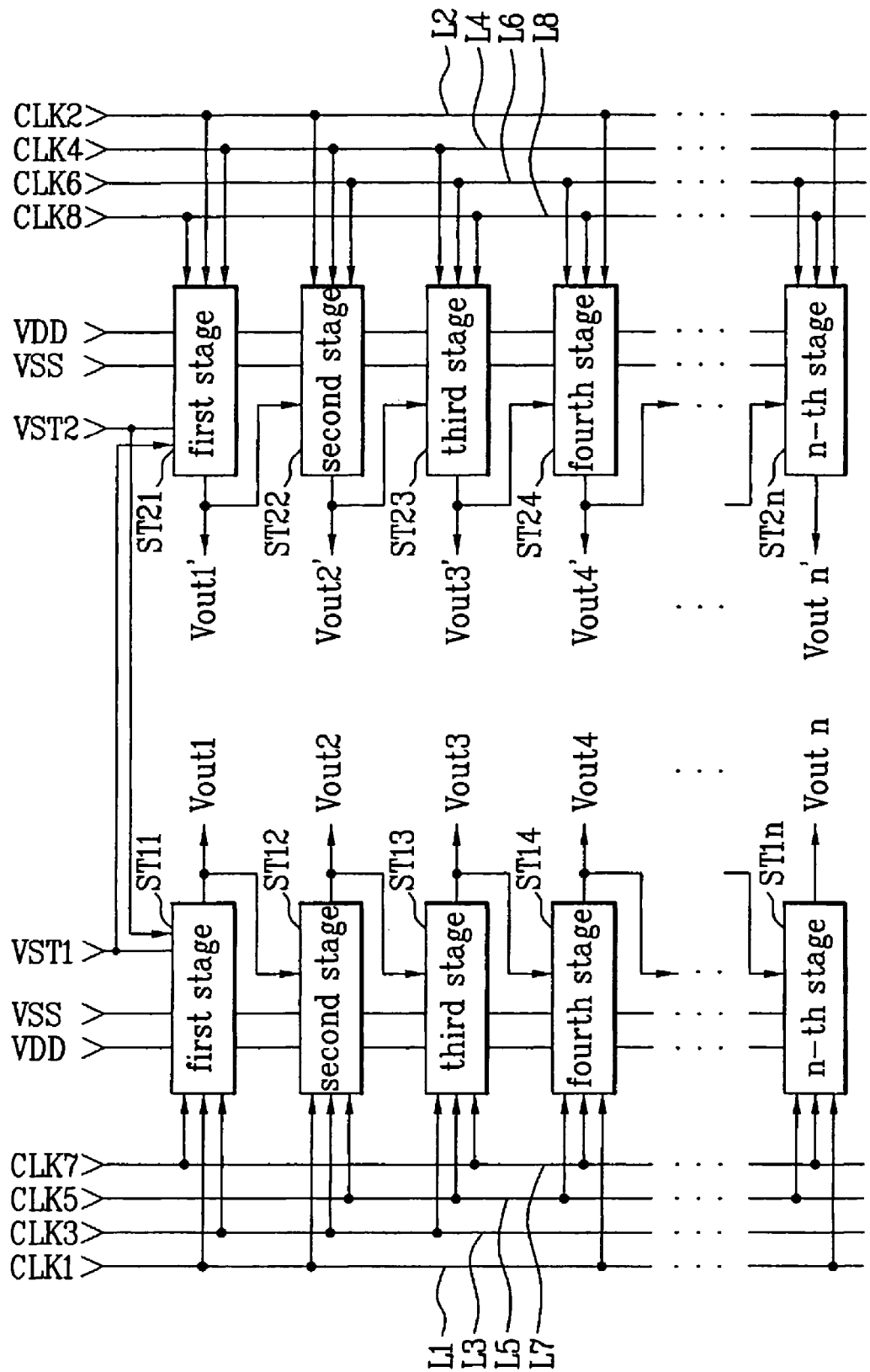
FIG. 4 is a block diagram that illustrates detailed configurations of first and second shift registers shown in FIG. 2.
Figure 5:
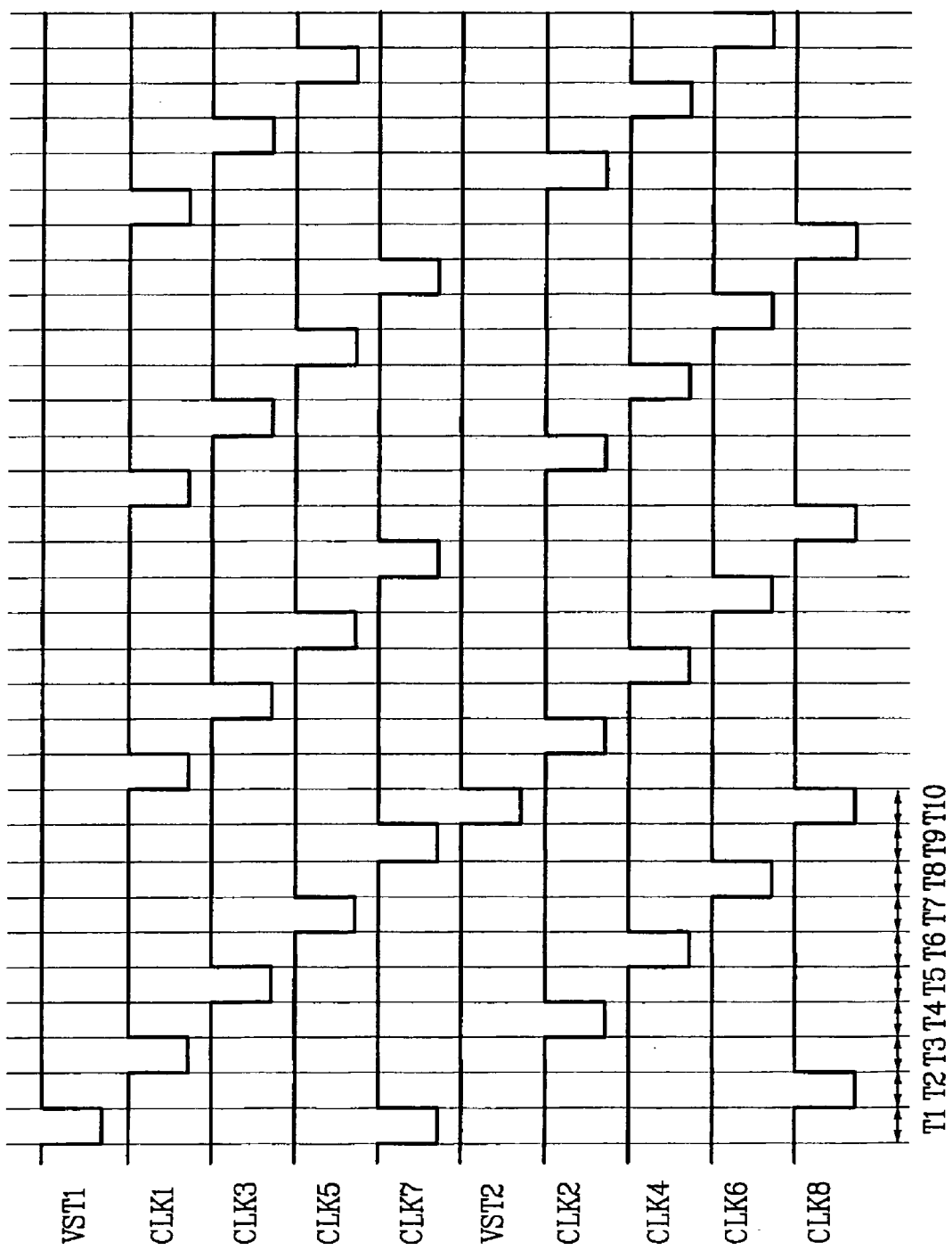
FIG. 5 is a timing diagram of various signals supplied to the first and second shift registers shown in FIG. 4.

FIG. 4 is a block diagram that illustrates detailed configurations of the first and second shift registers 201a and 201b. FIG. 5 is a timing diagram of various signals supplied to the first and second shift registers shown in FIG. 4.

As shown in FIG. 4, the first shift register 201a includes a plurality of stages ST11 to ST1n. Each of the stages ST11 to ST1n is connected to one end of an associated one of the gate lines GL1 to GLn. A first voltage VDD and a second voltage VSS are supplied to each of the stages ST11 to ST1n included in the first shift register 201a. Each of the stages ST11 to ST1n also receives three of a first clock pulse CLK1, a third clock pulse CLK3, a fifth clock pulse CLK5, and a seventh clock pulse CLK7 which are sequentially output. The first, third, fifth and seventh clock pulses CLK1, CLK3, CLK5 and CLK7 are output from a timing controller, and are supplied to associated ones of the stages ST11 to ST1n via a first clock transfer line L1, a third clock transfer line L3, a fifth clock transfer line L5, and a seventh clock transfer line L7, respectively. A first start pulse VST1 and a second start pulse VST2 are supplied to the first stage ST11 that will output a first scan pulse Vout1 earlier than those of the remaining stages ST12 to ST1n.

The stages ST11 to ST1n sequentially generate first scan pulses Vout1 to Voutn using associated ones of the clock pulses CLK1, CLK3, CLK5, and CLK7 and the first and second voltages VDD and VSS, and output the generated first scan pulses Vout1 to Voutn to the gate lines GL1 to GLn, respectively.

Thus, the stages ST11 to ST1n supply the first scan pulses Vout1 to Voutn to the gate lines GL1 to GLn in a sequential manner,. That is, in each subfield period, the first stage ST11 first outputs the first scan pulse Vout1 to the first gate line GL1. The second stage ST12 outputs the first scan pulse Vout2 to the second gate line GL2. In this order, the n-th stage ST1n finally outputs the first scan pulse Voutn to the n-th gate line GLn. These operations are repeated for all subfields. For example, the first through n-th stages ST11 to ST1n scan the first through n-th gate lines GL1 to GLn in a sequential manner in the first subfield period, and then scans the first through n-th gate lines GL1 to GLn in a sequential manner in the second subfield period.

An output terminal of each of the stages ST11 to ST1n (where an output terminal from which an associated one of the first scan pulses Vout1 to Voutn is output) is connected to one end of an associated one of the gate lines GL1 to GLn, and is connected to the downstream stage. That is, each of the stages ST11 to ST1n is enabled in response to the first scan pulse from the upstream stage. Each of the stages ST11 to ST1n then outputs a clock pulse received from the timing controller as a first scan pulse.

After outputting an associated one of the first scan pulses Vout1 to Voutn, each of the stages ST11 to ST1n is disabled by another clock pulse received from the timing controller. Each of the disabled states ST11 to ST1n supplies the second voltage VSS to the associated gate line, thereby turning off the switching element TrS connected to the associated gate line.

The first stage ST11, which outputs the associated first scan pulse Vout1 earlier than the remaining stages ST12 to ST1n, is enabled by the first start pulse VST1 supplied from the timing controller.

The second shift register 201b includes a plurality of stages ST21 to ST2n, as shown in FIG. 4. Each of the stages ST21 to ST2n is connected to the other end of an associated one of the gate lines GL1 to GLn. The first voltage VDD and second voltage VSS are supplied to each of the stages ST21 to ST2n included in the second shift register 201b. Each of the stages ST21 to ST2n also receives three of a second clock pulse CLK2, a fourth clock pulse CLK4, a sixth clock pulse CLK6, and an eighth clock pulse CLK8 that are sequentially output. The second, fourth, sixth, and eighth clock pulses CLK2, CLK4, CLK6 and CLK8 are output from the timing controller, and are supplied to associated ones of the stages ST21 to ST2n via a second clock transfer line L2, a fourth clock transfer line L4, a sixth clock transfer line L6, and an eighth clock transfer line L8, respectively. The first and second start pulses VST1 and VST2 are supplied to the first stage ST21 that will output a second scan pulse Vout1' earlier than those of the remaining stages ST22 to ST2n.

The stages ST21 to ST2n sequentially generate second scan pulses Vout1' to Voutn' using associated pulses of the clock pulses CLK2, CLK4, CLK6, and CLK8 and the first and second voltages VDD and VSS, and output the generated second scan pulses Vout1' to Voutn' to the gate lines GL1 to GLn, respectively.

Thus, the stages ST21 to ST2n supply the second scan pulses Vout1' to Voutn' to the gate lines GL1 to GLn in a sequential manner, respectively. That is, in each subfield period, the first stage ST21 first outputs the second scan pulse Vout1' to the first gate line GL1. The second stage ST22 outputs the second scan pulse Vout2 to the second gate line GL2. The n-th stage ST2n outputs the second scan pulse Voutn' to the n-th gate line GLn. These operations are repeated for all subfields. For example, the first through n-th stages ST21 to ST2n scan the first through n-th gate lines GL1 to GLn in a sequential manner in the first subfield period, and then scan the first through n-th gate lines GL1 to GLn in a sequential manner in the second subfield period.

An output terminal of each of the stages ST21 to ST2n (where an output terminal from which an associated one of the second scan pulses Vout1' to Voutn' is output) is connected to the other end of an associated one of the gate lines GL1 to GLn, and is connected to the downstream stage. That is, each of the stages ST21 to ST2n is enabled in response to the second scan pulse from the upstream stage. Each of the stages ST21 to ST2n then outputs a clock pulse received from the timing controller as a second scan pulse.

After outputting an associated one of the second scan pulses Vout1' to Voutn', each of the stages ST21 to ST2n is disabled by another clock pulse received from the timing controller. Each of the disabled states ST21 to ST2n supplies the second voltage VSS to the associated gate line, thereby turning off the switching element TrS connected to the associated gate line.

The first stage ST21, which outputs the associated second scan pulse Vout1' earlier than the remaining stages ST22 to ST2n, is enabled by the second start pulse VST2 supplied from the timing controller.

As described above, an ON voltage or OFF voltage is supplied to each of the data lines DL1 to DLm in synchronism with the point of time when an associated one of the first scan pulses Vout1 to Voutn from the first shift register 201a is supplied to an associated one of the gate lines GL1 to GLn. An OFF voltage is supplied to each of the data lines DL1 to DLm in synchronism with the point of time when an associated one of the second scan pulses Vout1' to Voutn' from the second shift register 201b is supplied to an associated one of the gate lines GL1 to GLn.

The first through eighth clock pulses CLK1 to CLK8, first and second start pulses VST1 and VST2, and first and second voltages VDD and VSS will be described in more detail.

As shown in FIG. 5, the first through eighth clock pulses CLK1 to CLK8 are output after being phase-delayed from one another by one pulse width. For example, the second clock pulse CLK2 is output after being phase-delayed from the first clock pulse CLK1 by one pulse width. The third clock pulse CLK3 is output after being phase-delayed from the second clock pulse CLK2 by one pulse width. The fourth clock pulse CLK4 is output after being phase-delayed from the third clock pulse CLK3 by one pulse width. The fifth clock pulse CLK5 is output after being phase-delayed from the fourth clock pulse CLK4 by one pulse width. The sixth clock pulse CLK6 is output after being phase-delayed from the fifth clock pulse CLK5 by one pulse width. The seventh clock pulse CLK7 is output after being phase-delayed from the sixth clock pulse CLK6 by one pulse width. The eighth clock pulse CLK8 is output after being phase-delayed from the seventh clock pulse CLK7 by one pulse width.

The first through eighth clock pulses CLK1 to CLK8 are sequentially and circularly output. For example, after sequential output of one set of first through eighth clock pulses CLK1 to CLK8, another set of first through eighth clock pulses CLK1 to CLK8 are sequentially output. The first clock pulse CLK1 is output between the point of time when the eighth clock pulse CLK8 is output and the point of time when the second clock pulse CLK2 is output.

The first start pulse VST1 is a signal that enables the first stage ST11 of the first shift register 201a. The first start pulse VST1 is output once in each subfield period. The first start pulse VST1 is output in synchronism with the seventh clock pulse CLK7.

The second start pulse VST2 is a signal that enables the first stage ST21 of the second shift register 201b. The second start pulse VST2 is output once in each subfield period. The second start pulse VST2 is output in synchronism with the eighth clock pulse CLK8.

The first and second voltages VDD and VSS have opposite polarities. For example, the first voltage VDD is a negative voltage, whereas the second voltage VSS is a positive voltage.

Each of the first and second shift registers 201a and 201b is a 4-phase shift register that is driven using four clock pulses sequentially output in a circulated manner. The stages of each of the first and second shift registers 201a and 201b are driven on the basis of 4 stages.

The order of the clock pulses CLK1, CLK3, CLK5, and CLK7 input to the stages ST11 to ST1n included in the first shift register 201a will be described.

The first stage ST11 is enabled by the first start pulse VST1 and the seventh clock pulse CLK7 input to the first stage ST11. The first stage ST11 then receives the first clock pulse CLK1 output next to the seventh clock pulse CLK7, and outputs the received first clock pulse CLK1 as the first scan pulse Vout1. The first stage ST11 is disabled by the third clock pulse CLK3 input to the first stage ST11 next to the first clock pulse CLK1.

The second stage ST12 is enabled by the scan pulse from the first stage11 and the first clock pulse CLK1 input to the second stage ST12. The second stage ST12 receives the third clock pulse CLK3 output next to the first clock pulse CLK1, and outputs the received third clock pulse CLK3 as the first scan pulse Vout2. The second stage ST12 is disabled by the fifth clock pulse CLK5 input to the second stage ST12 next to the third clock pulse CLK3.

The third stage ST13 is enabled by the scan pulse from the second stage12 and the third clock pulse CLK3 input to the third stage ST13. The third stage ST13 receives the fifth clock pulse CLK5 output next to the third clock pulse CLK3, and outputs the received fifth clock pulse CLK5 as the first scan pulse Vout3. The third stage ST13 is disabled by the seventh clock pulse CLK7 input to the third stage ST13 next to the fifth clock pulse CLK5.

The fourth stage ST14 is enabled by the scan pulse from the third stage13 and the fifth clock pulse CLK5 input to the fourth stage ST14. The fourth stage ST14 receives the seventh clock pulse CLK7 output next to the fifth clock pulse CLK5, and outputs the received seventh clock pulse CLK7 as the first scan pulse Vout4. The fourth stage ST14 is disabled by the first clock pulse CLK1 input to the fourth stage ST14 next to the seventh clock pulse CLK7.

The fifth through n-th stages ST15 to ST1n receive clock pulses in the same order as the clock pulses supplied to the first through fourth stages ST11 to ST14, respectively. For example, the fifth stage ST15 receives the seventh, first, and third clock pulses CLK7, CLK1, and CLK3 supplied to the first stage ST11. The sixth stage ST16 receives the first, third, and fifth clock pulses CLK1, CLK3, and CLK5 supplied to the second stage ST12. The seventh stage ST17 receives the third, fifth, and seventh clock pulses CLK3, CLK5, and CLK7 supplied to the third stage ST13. The eighth stage ST18 receives the fifth, seventh, and first clock pulses CLK5, CLK7, and CLK1 supplied to the fourth stage ST14.

In the enabling operation each of the stages ST11 to ST1n receives the first scan pulse from the upstream stage, in addition to the clock pulses input in the enabling operation. The first scan pulses Vout1 to Voutn output from the stages ST11 to ST1n are synchronous with the clock pulses supplied in the enabling operation of the stages ST11 to ST1n. Since there is no stage arranged upstream from the first stage ST11, the first stage ST11 is enabled by the first start pulse VST1 supplied from the timing controller and the clock pulse synchronous with the first start pulse VST1, for example, the seventh clock pulse CLK7.

The order of the clock pulses CLK2, CLK4, CLK6, and CLK8 input to the stages ST21 to ST2n included in the second shift register 201b will be described.

The first stage ST21 is first enabled by the second start pulse VST2 and the eighth clock pulse CLK8 input to the first stage ST21. The first stage ST21 then receives the second clock pulse CLK2 output next to the eighth clock pulse CLK8, and outputs the received second clock pulse CLK2 as the second scan pulse Vout1'. The first stage ST21 is disabled by the fourth clock pulse CLK4 input to the first stage ST21 next to the second clock pulse CLK2.

The second stage ST22 is enabled by the scan pulse from the first stage21 and the second clock pulse CLK2 input to the second stage ST22. The second stage ST22 receives the fourth clock pulse CLK4 output to the second clock pulse CLK2, and outputs the received fourth clock pulse CLK4 as the second scan pulse Vout2'. The second stage ST22 is disabled by the sixth clock pulse CLK6 input to the second stage ST22 next to the fourth clock pulse CLK4.

The third stage ST23 is enabled by the scan pulse from the second stage22 and the fourth clock pulse CLK4 input to the third stage ST23. The third stage ST23 receives the sixth clock pulse CLK6 output next to the fourth clock pulse CLK4, and outputs the received sixth clock pulse CLK6 as the second scan pulse Vout3'. The third stage ST23 is disabled by the eighth clock pulse CLK8 input to the third stage ST23 next to the sixth clock pulse CLK6.

The fourth stage ST24 is enabled by the scan pulse from the third stage23 and the sixth clock pulse CLK6 input to the fourth stage ST24. The fourth stage ST24 receives the eighth clock pulse CLK8 output next to the sixth clock pulse CLK6, and outputs the received eighth clock pulse CLK8 as the second scan pulse Vout4'. The fourth stage ST24 is disabled by the second clock pulse CLK2 input to the fourth stage ST24 next to the eighth clock pulse CLK8.

The fifth through n-th stages ST25 to ST2n receive clock pulses in the same order as the clock pulses supplied to the first through fourth stages ST21 to ST24, respectively. For example, the fifth stage ST25 receives the eighth, second, and fourth clock pulses CLK8, CLK2, and CLK4 supplied to the first stage ST21. The sixth stage ST26 receives the second, fourth, and sixth clock pulses CLK2, CLK4, and CLK6 supplied to the second stage ST22. The seventh stage ST27 receives the fourth, sixth, and eighth clock pulses CLK4, CLK6, and CLK8 supplied to the third stage ST23. The eighth stage ST28 receives the sixth, eighth, and second clock pulses CLK6, CLK8, and CLK2 supplied to the fourth stage ST24.

In the enabling operation each of the stages ST21 to ST2n receives the second scan pulse from the upstream stage, in addition to the clock pulses input in the enabling operation. The second scan pulses Vout1' to Voutn' output from the stages ST21 to ST2n are synchronous with the clock pulses supplied in the enabling operation of the stages ST21 to ST2n, respectively. Since there is no stage arranged upstream from the first stage ST21, the first stage ST21 is enabled by the second start pulse VST2 supplied from the timing controller and the clock pulse synchronous with the second start pulse VST2, namely, the eighth clock pulse CLK8.

The configurations of the stages ST11 to ST1n and ST21 to ST2n included in the first and second shift registers 201a and 201b will be described in more detail.

Figure 6:
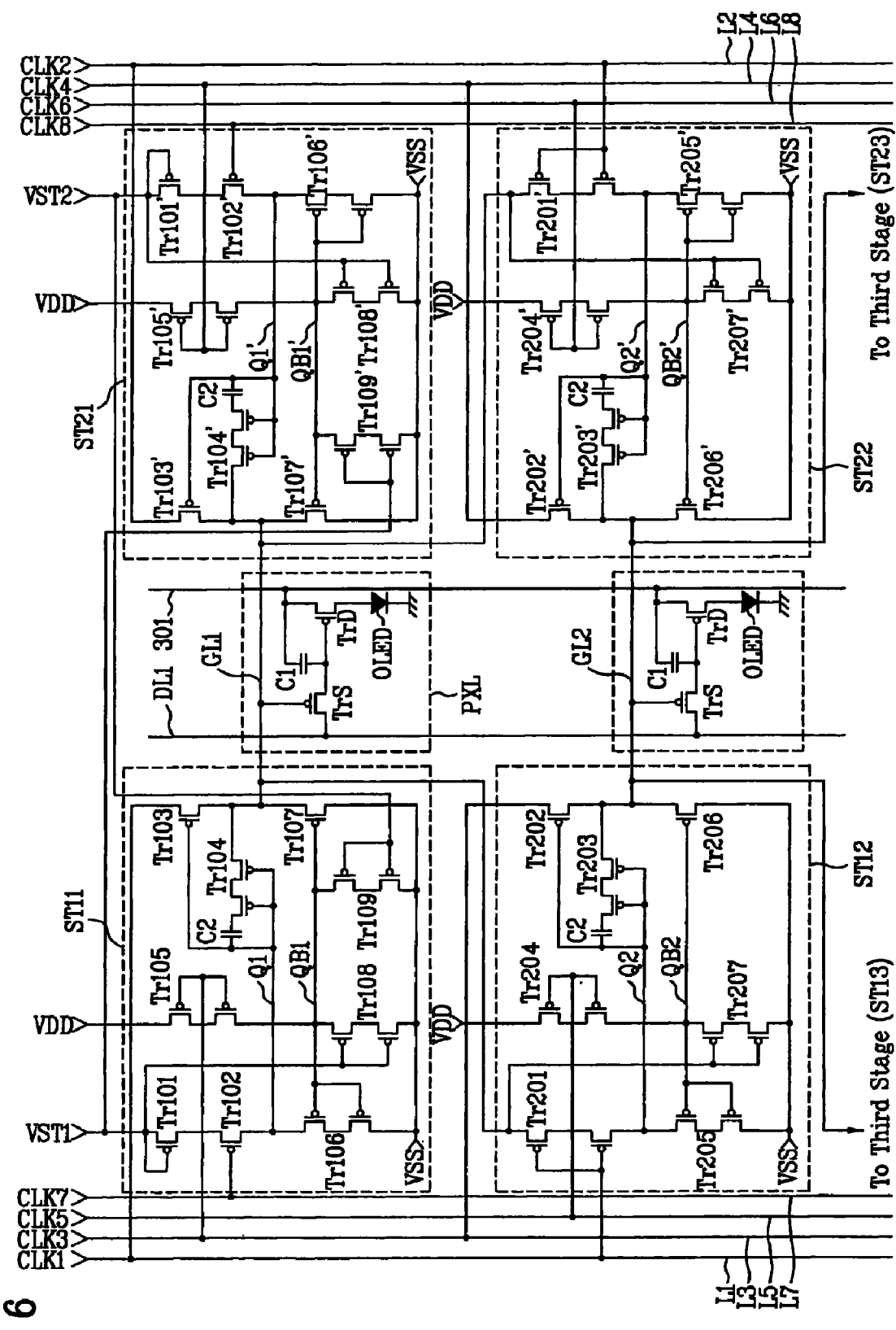
FIG. 6 is a circuit diagram that illustrates detailed configurations of the stages included in the first and second shift registers shown in FIG. 4.

FIG. 6 is a circuit diagram that illustrates detailed configurations of the stages included in the first and second shift registers shown in FIG. 4.

The first stage ST11 receives the first start pulse VST1 and clock pulses from the timing controller, and outputs the first scan pulse Vout1 earlier than the remaining stages of the first shift register 201a in the same subfield.

As shown in FIG. 6, the first stage ST11 includes the first shift register 201a that uses first through ninth switching elements Tr101 to Tr109, and a capacitor C2. The first stage ST11 of the first shift register 201a includes a node controller that controls the logic state of a first node Q1 and the logic state of a second node QB1, and an output unit that determines an output of the first stage ST11, based on the logic states of the first and second nodes Q1 and QB1. The node controller includes the first, second, fourth, fifth, sixth, eighth, and ninth switching elements Tr101, Tr102, Tr104, Tr105, Tr106, Tr108, and Tr109, whereas the output unit includes the third and sixth switching element Tr103 and Tr106.

Each of the first through ninth switching elements Tr101 to Tr109 included in the first stage ST11 is a P-type metal oxide semiconductor (MOS) transistor. Each of the fourth, fifth, sixth, eighth, and ninth switching elements Tr104, Tr105, Tr106, Tr108, and Tr109 of the first stage ST11 is a dual type switching element which consists of two switching elements.

The first switching element Tr101 responds to the first start pulse VST1 from the timing controller, to output the first start pulse VST1, and supplies the first start pulse VST1 to the source terminal of the second switching element Tr102. The first switching element Tr101 is connected, at the gate and source terminals thereof, to the transfer line that transfers the first start pulse VST1. The first switching element Tr101 is also connected, at the drain terminal thereof, to the source terminal of the second switching element Tr102.

The second switching element Tr102 supplies, to the first node Q1, the first start pulse VST1 output from the first switching element Tr101, in response to the seventh clock pulse CLK7 from the seventh clock transfer line L7. The second switching element Tr102 is connected, at the gate terminal thereof, to the seventh clock transfer line L7. The source terminal of the second switching element Tr102 is connected to the drain terminal of the first switching element Tr101. The drain terminal is connected to the first node Q1.

The third switching element Tr103 outputs the first clock pulse CLK1 from the first clock transfer line L1 as the first scan pulse Vout1, in response to the first start pulse VST1 supplied to the first node Q1, and supplies the first scan pulse Vout1 to one end of the associated gate line (the first gate line GL1), and to the downstream stage (the second stage ST12). The third switching element Tr103 is connected, at the gate terminal thereof, to the first node Q1. The source terminal of the third switching element Tr103 is connected to the first clock transfer line L1. The drain terminal is connected to the first gate line GL1 and second stage ST12. The third switching element Tr103 is a pull-up switching element that outputs the first clock pulse CLK1 as the first scan pulse Vout1.

One terminal of the capacitor C2 is connected to the first node Q1.

The fourth switching element Tr104 connects the other terminal of the capacitor C2 and one end of the associated gate line (the first gate line GL1) in response to the first start pulse VST1 supplied to the first node Q1. The gate terminal of the fourth switching element Tr104 is connected to the first node Q1. The source terminal of the fourth switching element Tr104 is connected to one end of the first gate line GL1. The drain terminal is connected to the other terminal of the capacitor C2.

The fifth switching element Tr105 supplies the first voltage VDD to the second node QB1 in response to the third clock pulse CLK3 from the third clock transfer line L3. The gate terminal of the fifth switching element Tr105 is connected to the third clock transfer line L3. The source terminal of the fifth switching element Tr105 is connected to the power line that transfers the first voltage VDD. The drain terminal is connected to the second node QB1.

The sixth switching element Tr106 supplies the second voltage VSS to the first node Q1 in response to the first voltage VDD supplied to the second node QB1. The sixth switching element Tr106 turns off the third and fourth switching elements Tr103 and Tr104, each of which is connected, at the gate terminal thereof, to the first node Q1. The gate terminal of the sixth switching element Tr106 is connected to the second node QB1. The source terminal of the sixth switching element Tr106 is connected to the power line that transfers the second voltage VSS. The drain terminal is connected to the first node Q1.

The seventh switching element Tr107 supplies the second voltage VSS to one end of the associated gate line (the first gate line GL1) and to the downstream stage (the second stage ST12), in response to the first voltage VDD supplied to the second node QB1. The gate terminal of the seventh switching element Tr107 is connected to the second the seventh switching element Tr107 is connected to one end of the first gate line GL1 and to the second stage ST12. The seventh switching element Tr107 is a pull-down switching element which outputs the second voltage VSS causing the associated gate line to be deactivated.

The eighth switching element Tr108 supplies the second voltage VSS to the second node QB1 in response to the first start pulse VST1, thereby turning off the sixth and seventh switching elements Tr106 and Tr107. The gate terminal of the eighth switching element Tr108 is connected to the transfer line that transfers the first start pulse VST1. The source terminal of the eighth switching element Tr108 is connected to the power line that transfers the second voltage VSS. The drain terminal is connected to the second node QB1.

The ninth switching element Tr109 supplies the second voltage VSS to the second node QB1 in response to the second start pulse VST2, thereby turning off the sixth and seventh switching elements Tr106 and Tr107. The gate terminal of the ninth switching element Tr109 is connected to the transfer line that transfers the second start pulse VST2. The source terminal of the ninth switching element Tr109 is connected to the power line that transfers the second voltage VSS. The drain terminal is connected to the second node QB1.

The second through n-th stages ST12 to ST1n included in the first shift register 201a will be described. The second through n-th stages ST12 to ST1n have the same configuration.

The second through n-th stages ST12 to ST1n receives the first scan pulse from the upstream stage and the clock pulses from the timing controller, and outputs an associated one of the first scan pulses Vout2 to Voutn.

Each of the second through n-th stages ST12 to ST1n uses first through seventh switching elements Tr201 to Tr207, and a capacitor C2. Similar to the first stage ST11, each of the second through n-th stages ST12 to ST1n includes a node controller and an output unit. The node controller includes the first, third, fourth, fifth, and seventh switching elements Tr201, Tr203, Tr204, Tr205, and Tr207, whereas the output unit includes the second and sixth switching element Tr202 and Tr206. The second switching element Tr202 is a pull-up switching element that outputs an associated one of the first scan pulses Vout2 to Voutn, whereas the sixth switching element Tr206 is a pull-down switching element that outputs the second voltage VSS.

Each of the first through seventh switching elements Tr201 to Tr207 is a P-type MOS transistor. Each of the first, third, fourth, fifth, and seventh switching elements Tr201, Tr203, Tr204, Tr205, and Tr207 is a dual type switching element that consists of two switching elements.

The first switching element Tr201 included in each of the second through n-th stages ST12 to ST1n supplies the first scan pulse from the upstream stage to the first node Q2 in response to an associated clock pulse. The associated clock pulse is identical to the clock pulse supplied to the pull-up switching element of the upstream stage. For example, the clock pulse supplied to the gate terminal of the first switching element Tr201 in the second stage ST12 is the first clock pulse CLK1 that is supplied to the source terminal of the pull-up switching element in the first stage ST11 (the third switching element Tr103).

The first switching element Tr201 included in the second stage ST12 supplies the first scan pulse Vout1 from the first stage ST11 to the first node Q2 in response to the first clock pulse CLK1. The gate terminal of the first switching element Tr201 of the second stage ST12 is connected to the first clock transfer line L1. The source terminal is connected to the output terminal of the first stage ST11. The drain terminal is connected to the first node Q2.

The second switching element Tr202 included in each of the second through n-th stages ST12 to ST1n responds to a first scan pulse supplied to the first node Q2, to output an associated clock pulse as a first scan pulse, and supplies the first scan pulse to one end of the associated gate line and to the downstream stage. The associated clock pulse is a clock pulse that is positioned between the clock pulse supplied to the pull-up switching element included in the upstream stage and the clock pulse supplied to the pull-up switching element included in the downstream stage. For example, the clock pulse supplied to the source terminal of the second switching element Tr202 included in the second stage ST12 is the third clock pulse CLK3 positioned between the first clock pulse CLK1 supplied to the source terminal of the pull-up switching element Tr103 included in the first stage ST11 and the fifth clock pulse CLK5 supplied to the source terminal of the pull-up switching element Tr202 included in the third stage ST13.

The second switching element Tr202 included in the second stage ST12 responds to the first scan pulse supplied to the first node Q2 (the first scan pulse Vout1 from the first stage ST11), to output the third clock pulse CLK3 as the first scan pulse Vout2, and supplies the first scan pulse Vout2 to one end of the gate line GL2 and to the third stage ST13. The gate terminal of the second switching element Tr202 of the second stage ST12 is connected to the first node Q2. The source terminal is connected to the third clock transfer line L3. The drain terminal is connected to one end of the second gate line GL2 and third stage ST13.

One terminal of the capacitor C2 is connected to the first node Q2.

The third switching element Tr203 included in each of the second through n-th stages ST12 to ST1n connects the other terminal of the capacitor C2 and one end of the associated one of the gate lines GL1 to GLn in response to the first scan pulse supplied to the first node Q2.

For example, the third switching element Tr203 included in the second stage ST12 connects the other terminal of the capacitor C2 and one end of the second gate line GL2 in response to the first scan pulse Vout1 supplied to the first node Q2. The gate terminal of the third switching element Tr203 is connected to the first node Q2. The source terminal is connected to one end of the second gate line GL2. The drain terminal is connected to the other terminal of the capacitor C2.

The fourth switching element Tr204 included in each of the second through n-th stages ST12 to ST1n supplies the first voltage VDD to the second node QB2 in response to an associated clock pulse. The associated clock pulse is the clock pulse that is positioned between the clock pulse supplied to the fourth switching element Tr204 included in the upstream stage and the clock pulse supplied to the fourth switching element Tr204 included in the downstream stage.

For example, the clock pulse supplied to the gate terminal of the fourth switching element Tr204 included in the second stage ST12 is the fifth clock pulse CLK5 that is output between the third clock pulse CLK3 supplied to the source terminal of the fifth switching element Tr105 of the first stage ST11 (the fifth switching element Tr105 of the first stage ST11 has the same function as the fourth switching elements Tr204 of the second through n-th stages ST12 to ST1n) and the seventh clock pulse CLK7 supplied to the source terminal of the fourth switching element Tr204 of the third stage ST13.

The fourth switching element Tr204 included in the second stage ST12 supplies the first voltage VDD to the second node QB2 in response to the fifth clock pulse CLK5. The gate terminal of the fourth switching element Tr204 is connected to the fifth clock transfer line L5. The source terminal is connected to the power line that transfers the first voltage VDD. The drain terminal is connected to the second node QB2.

The fifth switching element Tr205 included in each of the second through n-th stages ST12 to ST1n supplies the second voltage VSS to the first node Q2 in response to the first voltage VDD supplied to the second node QB2. The fifth switching element Tr205 turns off the second and third switching elements Tr202 and Tr203, each of which is connected, at the gate terminal thereof, to the first node Q2. The gate terminal of the fifth switching element Tr205 is connected to the second node QB2. The source terminal is connected to the power line that transfers the second voltage VSS. The drain terminal is connected to the first node Q2.

The sixth switching element Tr206 included in each of the second through n-th stages ST12 to ST1n supplies the second voltage VSS to one end of the associated gate line and to the downstream stage, in response to the first voltage VDD supplied to the second node QB2.

For example, the sixth switching element Tr206 of the second stage ST12 supplies the second voltage VSS to one end of the second gate line GL2 and to the third stage ST13, in response to the first voltage VDD supplied to the second node QB2. The gate terminal of the sixth switching element Tr206 is connected to the second node QB2. The source terminal is connected to the power line that supplies the second voltage VSS. The drain terminal is connected to one end of the second gate line GL2 and to the third stage ST13.

The seventh switching element Tr207 included in each of the second through n-th stages ST12 to ST1n supplies the second voltage VSS to the second node QB2 in response to the first scan pulse from the upstream stage. Thus, the seventh switching element Tr207 turns off the fifth and sixth switching elements Tr205 and Tr206, each of which is connected, at the gate terminal thereof, to the second node QB2.

The second, third, fourth, fifth, sixth, seventh, and eighth switching elements Tr102, Tr103, Tr104, Tr105, Tr106, Tr107, and Tr108 included in the first stage ST11 correspond to and have the same functions as the first, second, third, fourth, fifth, sixth, seventh switching elements Tr201, Tr202, Tr203, Tr204, Tr205, Tr206, and Tr207 included in each of the second through n-th stages ST12 to ST1n, respectively.

The configurations of the stages ST21 to ST2n included in the second shift register 201b will be described.

The first stage ST21 of the second shift register 201b has the same configuration as the first stage ST11 of the first shift register 201a. The second through n-th stages ST22 to ST2n of the second shift register 201b have the same configurations as the second through n-th stages ST12 to ST1n of the first shift register 201a, respectively.

The first through n-th stages ST21 to ST2n of the second shift register 201b do not receive odd-numbered clock pulses CLK1, CLK3, CLK5, and CLK7, but receive even-numbered clock pulses CLK2, CLK4, CLK6, and CLK8. The first through n-th stages ST21 to ST2n of the second shift register 201b receive the second, fourth, sixth, and eighth clock pulses CLK2, CLK4, CLK6, and CLK8.

The configurations of the stages ST21 to ST2n included in the second shift register 201b will be described in detail.

The first stage ST11 included in the first shift register 201a will be described.

The second shift register 201b receives the second start pulses VST2 and clock pulses from the timing controller, and outputs second scan pulses Vout1' to Voutn'. The first stage ST21 of the second shift register 201b uses first through ninth switching elements Tr101' to Tr109', and a capacitor C2. The first stage ST11 of the second shift register 201b includes a node controller that controls the logic state of a first node Q1' and the logic state of a second node QB1'. An output unit determines an output of the first stage ST21, based on the logic states of the first and second nodes Q1' and QB1'. The node controller includes the first, second, fourth, fifth, sixth, eighth, and ninth switching elements Tr101', Tr102', Tr104', Tr105', Tr106', Tr108', and Tr109', whereas the output unit includes the third and sixth switching element Tr103' and Tr106'.

The first switching element Tr101' responds to the second start pulse VST2, to output the second start pulse VST2, and supplies the second start pulse VST2 to the source terminal of the second switching element Tr102'. The first switching element Tr101' is connected, at the gate and source terminals thereof, to the transfer line that transfers the second start pulse VST2. The drain terminal of the first switching element Tr101' is connected to the source terminal of the second switching element Tr102'.

The second switching element Tr102' supplies, to the first node Q1', the second start pulse VST2 output from the first switching element Tr101', in response to the eighth clock pulse CLK8 from the eighth clock transfer line L8. The gate terminal of the second switching element Tr102' is connected to the eight clock transfer line L8. The source terminal of the second switching element Tr102' is also connected, at thereof, to the drain terminal of the first switching element Tr101', and is connected, at the drain terminal thereof, to the first node Q1'.

The third switching element Tr103' outputs the second clock pulse CLK2 from the second clock transfer line L2 as a second scan pulse, in response to the second start pulse VST2 supplied to the first node Q1', and supplies the second scan pulse to the other end of the associated gate line (the first gate line GL1), and to the downstream stage (the second stage ST22). The third switching element Tr103' is connected, at the gate terminal thereof, to the first node Q1'. The source terminal of the third switching element Tr103' is connected to the second clock transfer line L2. The drain terminal is connected to the other end of the first gate line GL1 and second stage ST22. The third switching element Tr103' is a pull-up switching element which outputs the second clock pulse CLK2 as the second scan pulse Vout1'.

One terminal of the capacitor C2 is connected to the first node Q1'.

The fourth switching element Tr104' connects the other terminal of the capacitor C2 and the other end of the associated gate line (the first gate line GL1) in response to the second start pulse VST2 supplied to the first node Q1'. The fourth switching element Tr104' is connected, at the gate terminal thereof, to the first node Q1'. The source terminal of the fourth switching element Tr104' is connected to the other end of the first gate line GL1. The drain terminal is connected to the other terminal of the capacitor C2.

The fifth switching element Tr105' supplies the first voltage VDD to the second node QB1' in response to the fourth clock pulse CLK4 from the fourth clock transfer line L4. The fifth switching element Tr105' is connected, at the gate terminal thereof, to the fourth clock transfer line L4. The source terminal of the fifth switching element Tr105' is connected to the power line which transfers the first voltage VDD. The drain terminal is connected to the second node QB1'.

The sixth switching element Tr106' supplies the second voltage VSS to the first node Q1' in response to the first voltage VDD supplied to the second node QB1'. The sixth switching element Tr106' turns off the third and fourth switching elements Tr103' and Tr104', each of which is connected, at the gate terminal thereof, to the first node Q1'. The sixth switching element Tr106' is connected, at the gate terminal to the second node QB1'. The sixth switching element Tr106' is connected, at the source terminal to the power line that transfers the second voltage VSS the drain terminal is connected to the first node Q1'.

The seventh switching element Tr107' supplies the second voltage VSS to the other end of the associated gate line (the first gate line GL1) and to the downstream stage (the second stage ST22), in response to the first voltage VDD supplied to the second node QB1'. The seventh switching element Tr107' is connected, at the gate terminal thereof, to the second node QB1'. The source terminal is connected to the power line that supplies the second voltage VSS. The drain terminal of the seventh switching element Tr107' is connected to the other end of the first gate line GL1 and to the second stage ST22. Thus, the seventh switching element Tr107' is a pull-down switching element that outputs the second voltage VSS causing the associated gate line to be deactivated.

The eighth switching element Tr108' supplies the second voltage VSS to the second node QB1' in response to the second start pulse VST2, thereby turning off the sixth and seventh switching elements Tr106' and Tr107'. The gate terminal of the eighth switching element Tr108' is connected to the transfer line that transfers the second start pulse VST2. The eighth switching element Tr108' is connected, at the source terminal to the power line that transfers the second voltage VSS. The drain terminal is connected to the second node QB1'.

The ninth switching element Tr109' supplies the second voltage VSS to the second node QB1' in response to the first start pulse VST1, thereby turning off the sixth and seventh switching elements Tr106' and Tr107'. The gate terminal of the ninth switching element Tr109' is connected to the transfer line that transfers the first start pulse VST1. The source terminal of the ninth switching element Tr109' is connected to the power line that transfers the second voltage VSS. The drain terminal is connected to the second node QB1'.

The second through n-th stages ST22 to ST2*n* included in the second shift register 201*b* will be described.

The second through n-th stages ST22 to ST2*n* receives the second scan pulse from the upstream stage and the clock pulses from the timing controller, and outputs an associated one of the second scan pulses Vout2' to Vout*n*'.

Each of the second through n-th stages ST22 to ST2*n* uses first through seventh switching elements Tr201' to Tr207', and a capacitor C2. Each of the second through n-th stages ST22 to ST2*n* includes a node controller and an output unit. The node controller includes the first, third, fourth, fifth, and seventh switching elements Tr201', Tr203', Tr204', Tr205', and Tr207', whereas the output unit includes the second and sixth switching element Tr202' and Tr206'. The second switching element Tr202' is a pull-up switching element, whereas the sixth switching element Tr206' is a pull-down switching element.

The first switching element Tr201' included in each of the second through n-th stages ST22 to ST2*n* supplies the second scan pulse from the upstream stage to the first node Q2' in response to an associated clock pulse. The associated clock pulse is identical to the clock pulse supplied to the pull-up switching element of the upstream stage. For example, the clock pulse supplied to the gate terminal of the first switching element Tr201' in the second stage ST22 is the second clock pulse CLK2 that is supplied to the source terminal of the pull-up switching element in the first stage ST21 (the third switching element Tr103').

The first switching element Tr201' included in the second stage ST22 supplies the second scan pulse Vout1' from the first stage ST21 to the first node Q2' in response to the second clock pulse CLK2. The first switching element Tr201' of the second stage ST22 is connected, at the gate terminal to the second clock transfer line L2. The source terminal is connected to the output terminal of the first stage ST21. The drain terminal is connected to the first node Q2'.

The second switching element Tr202' included in each of the second through n-th stages ST22 to ST2*n* responds to a second scan pulse supplied to the first node Q2', to output an associated clock pulse as a second scan pulse, and supplies the second scan pulse to the other end of the associated gate line and to the downstream stage. The associated clock pulse is a clock pulse that is positioned between the clock pulse supplied to the pull-up switching element included in the upstream stage and the clock pulse supplied to the pull-up switching element included in the downstream stage. For example, the clock pulse supplied to the source terminal of the second switching element Tr202' included in the second stage ST22 is the fourth clock pulse CLK4 positioned between the second clock pulse CLK2 supplied to the source terminal of the pull-up switching element Tr103' that is included in the first stage ST21 and the sixth clock pulse CLK6 supplied to the source terminal of the pull-up switching element Tr202' included in the third stage ST23.

The second switching element Tr202' included in the second stage ST22 responds to the second scan pulse supplied to the first node Q2' (the second scan pulse Vout1' from the first stage ST21), to output the fourth clock pulse CLK4 as the second scan pulse Vout2', and supplies the second scan pulse Vout2' to the other end of the gate line GL2 and to the third stage ST23. The second switching element Tr202' of the second stage ST22 is connected, at the gate terminal to the first node Q2'. The source terminal is connected to the fourth clock transfer line L4. The drain terminal is connected to the other end of the second gate line GL2 and third stage ST23.

One terminal of the capacitor C2 is connected to the first node Q2'.

The third switching element Tr203' included in each of the second through n-th stages ST22 to ST2*n* connects the other terminal of the capacitor C2 and the other end of the associated gate line in response to the second scan pulse supplied to the first node Q2'.

For example, the third switching element Tr203' included in the second stage ST22 connects the other terminal of the capacitor C2 and the other end of the second gate line GL2 in response to the second scan pulse Vout1' supplied to the first node Q2'. The third switching element Tr203' is connected, at the gate terminal thereof, to the first node Q2'. The source terminal is connected to the other end of the second gate line GL2. The drain terminal is connected to the other terminal of the capacitor C2.

The fourth switching element Tr204' is included in each of the second through n-th stages ST22 to ST2*n* supplies the first voltage VDD to the second node QB2' in response to an associated clock pulse. The associated clock pulse is the clock pulse that is positioned between the clock pulse supplied to the fourth switching element Tr204' included in the upstream stage and the clock pulse supplied to the fourth switching element Tr204' included in the downstream stage.

For example, the clock pulse supplied to the gate terminal of the fourth switching element Tr204' included in the second stage ST22 is the sixth clock pulse CLK6 that is output between the fourth clock pulse CLK4 supplied to the source terminal of the fifth switching element Tr105' of the first stage ST21 (the fifth switching element Tr105' of the first stage ST21 has the same function as the fourth switching elements Tr204' of the second through n-th stages ST22 to ST2*n*) and the eighth clock pulse CLK8 supplied to the source terminal of the fourth switching element Tr204' of the third stage ST23.

The fourth switching element Tr204' included in the second stage ST22 supplies the first voltage VDD to the second node QB2' in response to the sixth clock pulse CLK6. The fourth switching element Tr204' is connected, at the gate terminal thereof, to the sixth clock transfer line L6. The source terminal is connected to the power line that transfers the first voltage VDD. The drain terminal is connected to the second node QB2'.

The fifth switching element Tr205' included in each of the second through n-th stages ST22 to ST2*n* supplies the second voltage VSS to the first node Q2' in response to the first voltage VDD supplied to the second node QB2'. The fifth switching element Tr205' turns off the second and third switching elements Tr202' and Tr203', each of which is connected, at the gate terminal thereof, to the first node Q2'. The gate terminal of the fifth switching element Tr205' is connected to the second node QB2'. The source terminal is connected to the power line that transfers the second voltage VSS. The drain terminal is connected to the first node Q2'.

The sixth switching element Tr206' included in each of the second through n-th stages ST22 to ST2n supplies the second voltage VSS to the other end of the associated gate line and to the downstream stage, in response to the first voltage VDD supplied to the second node QB2'.

For example, the sixth switching element Tr206' of the second stage ST22 supplies the second voltage VSS to the other end of the second gate line GL2 and to the third stage ST23, in response to the first voltage VDD supplied to the second node QB2'. The gate terminal of the sixth switching element Tr206' is connected to the second node QB2'. The source terminal is connected to the power line that supplies the second voltage VSS. The drain terminal is connected to the other end of the second gate line GL2 and to the third stage ST23.

The seventh switching element Tr207' included in each of the second through n-th stages ST22 to ST2n supplies the second voltage VSS to the second node QB2' in response to the second scan pulse from the upstream stage. The seventh switching element Tr207' turns off the fifth and sixth switching elements Tr205' and Tr206', each of which is connected, at the gate terminal thereof, to the second node QB2'.

The second, third, fourth, fifth, sixth, seventh, and eighth switching elements Tr102', Tr103', Tr104', Tr105', Tr106', Tr107', and Tr108' included in the first stage ST21 correspond to and have the same functions as the first, second, third, fourth, fifth, sixth, seventh switching elements Tr201', Tr202', Tr203', Tr204', Tr205', Tr206', and Tr207' included in each of the second through n-th stages ST12 to ST1n, respectively.

Operation of the luminescent display device that has the above-described configuration will be described in detail.

In a first period T1, only the first start pulse VST1 and seventh clock pulse CLK7 are maintained in a low-level state, whereas the remaining clock pulses are maintained in a high-level state, as shown in FIG. 5. The first start pulse VST1 is output once in each subfield, and is synchronous with the seventh clock pulse CLK7.

The first start pulse VST1 and seventh clock pulse CLK7 are supplied to the first stage ST11 of the first shift register 201a. For example, the first start pulse VST1 is input to the gate terminals of the first and eighth switching elements Tr101 and Tr108 in the first stage ST11, whereas the seventh clock pulse CLK7 is supplied to the gate terminal of the second switching element Tr102 in the first stage ST1.

The first switching element Tr101 is turned on as a result. Accordingly, the first start pulse VST1 is applied to the first node Q1 via the turned-on first switching element Tr101. The first node Q1 is maintained in a low-level state. As a result, the third and fourth switching elements Tr103 and Tr104 are turned on, each of which is connected, at the gate terminal thereof, to the first node Q1. Accordingly, in the first period T1, the gate and drain terminals of the third switching element Tr103 are connected to each other via the capacitor C2.

The eighth switching element Tr108 is turned on by the first start pulse VST1. The second voltage VSS is supplied to the second node QB1 via the turned-on eighth switching element Tr108. The second node QB1 is maintained in a high-level state by the second voltage VSS. Thus, the sixth and seventh switching elements Tr106 and Tr107 are turned off, each of which is connected, at the gate terminal thereof, to the second node QB1.

The first start pulse VST1 output in the first period T1 is also supplied to the first stage ST21 of the second shift register 201b. For example, the first start pulse VST1 is supplied to the gate terminal of the ninth switching element Tr109' in the first stage ST21, thereby causing the ninth switching element Tr109' to be turned on. The second voltage VSS is supplied to the second node QB1' of the first stage ST21 via the turned-on ninth switching element Tr109'. Thus, the second node QB1' of the first stage ST21 of the second shift register 201b is maintained in a high-level state in the first period T1. The sixth and seventh switching elements Tr106' and Tr107' are turned off, each of which is connected, at the gate terminal thereof, to the second node QB1'. Since the remaining clock pulses other than the first start pulse VST1 and seventh clock pulse CLK7 are maintained in a high-level state in the first period T1, as described above, the first node Q1' of the first stage ST21 of the second shift register 201b is also maintained in a high-level state.

During the first period T1, the first node Q1 of the first stage ST11 of the first shift register 201a is maintained in a low-level state, whereas the second node QB1 of the first stage ST11 of the first shift register 201a is maintained in a high-level state. For example, the first stage ST11 is enabled in the first period T1. Both the first and second nodes Q1' and QB1' of the first stage ST21 of the second shift register 201b are maintained in a high-level state.

During the first period T1, the third switching element Tr103 in the first stage ST11 of the first shift register 201a is maintained in an ON state, whereas the seventh switching element Tr107 in the first stage ST11 of the first shift register 201a is maintained in an OFF state. Both the third and seventh switching elements Tr103' and Tr107' in the first stage ST21 of the second shift register 201b are maintained in an OFF state. During the first period T1, the first stage ST11 of the first shift register 201a is connected to the first gate line GL1, whereas the first stage ST21 of the second shift register 201b is floated from the first gate line GL1.

Operations in the second period T2 will be described.

In the second period T2, only the eighth clock pulse CLK8 is maintained in a low-level state, whereas the remaining clock pulses are maintained in a high-level state, as shown in FIG. 5.

The eighth clock pulse CLK8 is supplied to the second switching element Tr102' in the first stage ST21 of the second shift register 201b. For example, the eighth clock pulse CLK8 is supplied to the gate terminal of the second switching element Tr102'. In the second period T2, the second switching element Tr102' is turned on.

Since the second start pulse VST2 is maintained in a high-level state in the second period T2, the first switching element Tr101' in the first stage ST21 of the second shift register 201b, which receives the second start pulse VST2, is maintained in an OFF state. Accordingly, the first node Q1' of the second shift register 201b is still maintained in a high-level state in the second period T2. The second node QB1' of the second shift register 201b is also still maintained in a high-level state in accordance with the operation carried out in the first period T1.

In even-numbered periods that include the second period T2, the even-numbered clock pulses CLK2, CLK4, CLK6, and CLK8 are supplied to the stages ST21 to ST2n of the second shift register 201b. In spite of the supply of these clock pulses, the stages ST21 to ST2n of the second shift register 201b are not driven before the second start pulse VST2 is supplied. For example, the stages ST21 to ST2n of the second shift register 201b are maintained in a disabled state until the second start pulse VST2, which has a low level, is supplied to the first stage ST21.

Operations in the third period T3 will be described.

In the third period T3, only the first clock pulse CLK1 is maintained in a low-level state, whereas the remaining clock pulses are maintained in a high-level state, as shown in FIG. 5.

In the third period T3, the first and second switching elements Tr101 and Tr102 in the first stage ST11 of the first shift register 201a are turned off by the first start pulse VST1 and seventh clock pulse CLK7 which have a high level. The first node Q1 of the first stage ST11 is floated. Since the first node Q1 is still maintained in a low-level state by the first start pulse VST1 which was applied in the first period T1, the third and fourth switching elements Tr103 and Tr104, each of which is connected, at the gate terminal thereof, to the first node Q1, is still maintained in an ON state.

When the first clock pulse CLK1 is applied to the source terminal of the third switching element Tr103 in the above-described state, the first start pulse VST1 charged in the first node Q1 is amplified in accordance with boot strapping. The third switching element Tr103 connected, at the gate terminal thereof, to the first node Q1 is rendered to be completely turned on. The first clock pulse CLK1 applied to the drain terminal of the third switching element Tr103 is stably output via the third switching element Tr103.

The first clock pulse CLK1 output via the third switching element Tr103 is supplied to the first gate line GL1 as the first scan pulse Vout1 that drives the first gate line GL1. The first clock pulse CLK1 output as described above is also supplied to the second stage ST12 of the first shift register 201a as the start pulse that enables the second stage ST12.

The first scan pulse Vout1 is supplied to the first gate line GL1, the switching elements TrS of the pixel cells PXL are connected to the first gate line GL1 are turned on. Accordingly, an ON voltage from the first data line DL1 can be supplied to the drive switching elements TrD of the pixel cells PXL via the turned-on switching elements TrS, respectively, thereby causing the drive switching elements TrD to be turned on. Current is supplied to the light emitting elements OLED of the pixel cells PXL, so that the light emitting elements OLED emit light by virtue of the supplied current. The ON voltage supplied to the gate terminal of each drive switching element TrD is maintained by the associated capacitor C2.

The first scan pulse Vout1 output from the first stage ST11 of the first shift register 201a is supplied to the first switching element Tr201 in the second stage ST12 of the first shift register 201a. For example, the first scan pulse Vout1 is supplied to the source terminal of the first switching element Tr201. The first switching element Tr201 also receives the first clock pulse CLK1 applied to the gate terminal of the first switching element Tr201. In the third period T3, the first switching element Tr201 of the second stage ST12 is turned on. As a result, the first scan pulse Vout1 from the first stage ST11 is supplied to the first node Q2 of the second stage ST12 via the turned-on first switching element Tr201. Thus, the first node Q2 of the second stage ST12 is maintained in a low-level state in the third period T3. Accordingly, the second and third switching elements Tr202 and Tr203 are turned on, each of which is connected, at the gate terminal thereof, to the first node Q2 of the second stage ST12.

The first scan pulse Vout1 output from the first stage ST11 of the first shift register 201a is also supplied to the seventh switching element Tr207 of the second stage ST12. For example, the first scan pulse Vout1 is supplied to the gate terminal of the seventh switching element Tr207, thereby causing the seventh switching element Tr207 to be turned on. The second voltage VSS is supplied to the second node QB2 via the turned-on seventh switching element Tr207. Thus, the second node QB2 of the second stage ST12 is maintained in a high-level state. Accordingly, the fifth and sixth switching elements Tr205 and Tr206 connected to the second node QB2 are turned off.

During the third period T3, the first stage ST11 of the first shift register 201a outputs the first scan pulse Vout1, and the second stage ST12 arranged directly downstream from the first stage ST11 is enabled in response to the first scan pulse Vout1 and first clock pulse CLK1.

The first stage ST11 of the first shift register 201a and the first stage ST21 of the second shift register 201b are connected to each other via the first gate line GL1. During the third period T3, the first scan pulse Vout1 output from the first stage ST11 of the first shift register 201a is also supplied to the first stage ST21 of the second shift register 201b via the first gate line GL1.

The first scan pulse Vout1 may be supplied to the gate terminal of the third switching element Tr103' included in the first stage ST21 of the second shift register 201b. This phenomenon is prevented by the fourth switching element Tr104' included in the first stage ST21 of the second shift register 201b. For example, since the first node Q1' in the first stage ST21 of the second shift register 201b is maintained in a high-level state in the third period T3, the fourth switching element Tr104', which is connected, at the gate terminal thereof, to the first node Q1', is maintained in an OFF state.

The first scan pulse Vout1 supplied via the first gate line GL1 cannot be supplied to the gate terminal of the third switching element Tr103' of the first stage ST21. The fourth switching element Tr204 functions to prevent the first stage ST21 of the second shift register 201b from malfunctioning due to the first scan pulse Vout1 generated when the first stage ST11 of the first shift register 201a is driven.

Since the other end of the first gate line GL is connected to the second stage ST22 of the second register 201b, the first scan pulse Vout1 output from the first stage ST11 of the first shift register 201a is also supplied to the second stage ST22 via the first gate line GL1. For example, the first scan pulse Vout1 is supplied to both the source terminal of the second switching element Tr202' and the gate terminal of the seventh switching element Tr207' in the second stage ST22. The second switching element Tr202' cannot output the first scan pulse Vout1 supplied thereto because the second switching element Tr202' is maintained in an OFF state. The seventh switching element Tr207' is turned on by the first scan pulse Vout1. The turned-on seventh switching element Tr207' supplies the second voltage VSS to the second node QB2', thereby rendering the second node QB2' to be in a high-level state.

During the third period T3, the first and second nodes Q2' and QB2' in the second stage ST22 of the second shift register 201b are changed to a high-level state. During the second stage ST22 of the second shift register 201b is floated from the second gate line GL2 in the third period T3.

The first stage ST11 of the second shift register 201b is floated from the first gate line GL1 by the first start pulse VST2, whereas the second through n-th stages ST22 to ST2n of the second shift register 201b are floated from the associated gate lines by the associated first scan pulses from the first through n−1-th stages of the first shift register 201a, respectively. It is possible to prevent the first and second shift registers 201a and 201b from simultaneously outputting scan pulses to the same gate line.

Operations in the fourth period T4 will be described.

During the fourth period T4, only the second clock pulse CLK2 is maintained in a low-level state, whereas the remaining clock pulses are maintained in a high-level state, as shown in FIG. 5. For example, the stages ST21 to ST2n are still maintained in a disabled state in the fourth period T4 because the second start pulse VST2 is still maintained in a high-level state.

Operations in the fifth period T5 will be described.

In the fifth period T5, only the third clock pulse CLK3 is maintained in a low-level state, whereas the remaining clock pulses are maintained in a high-level state, as shown in FIG. 5.

The third clock pulse CLK3 is supplied to the second switching element Tr202 in the second stage ST12 of the first shift register 201a. For example, the third clock pulse CLK3 is supplied to the source terminal of the second switching element Tr202. Since the gate terminal of the second switching element Tr202 is connected to the first node Q1 which is maintained in a low-level state by the first scan pulse Vout1 supplied in the third period T3, the second switching element Tr202 is turned on in the fifth period T5. The turned-on second switching element Tr202 outputs the third clock pulse CLK3 applied to the source terminal of the second switching element Tr202. Thus, the second switching element Tr202 supplies the third clock pulse CLK3 to the second gate line GL2 as the first scan pulse Vout2, and to the third stage ST13 as a start pulse.

In accordance with the above-described operation, the third stage ST13 renders the first node thereof to be in a low-level state, in response to the first scan pulse Vout2 from the second stage ST12. For example, in the fifth period T5, the second stage ST12 of the first shift register 201a outputs the first scan pulse Vout2, and the third stage ST13 arranged directly downstream from the second stage ST12 is enabled in response to the first scan pulse Vout2.

The third clock pulse CLK3 is also supplied to the fifth switching element Tr105 in the first stage ST11 of the first shift register 201a. For example, the third clock pulse CLK3 is supplied to the gate terminal of the fifth switching element Tr105. The fifth switching element Tr105 is turned on, thereby causing the first voltage VDD to be supplied to the second node QB1 via the turned-on fifth switching element Tr105. The second node QB1 is maintained in a low-level state. The sixth and seventh switching elements Tr106 and Tr107, each of which is connected, at the gate terminal thereof, to the second node QB1, are turned on.

The second voltage VSS is supplied to the first node QB1 of the first stage ST11 via the turned-on sixth switching element Tr106. The first node QB1 is maintained in a high-level state, so that the third and fourth switching elements Tr103 and Tr104, each of which is connected, at the gate terminal thereof, to the first node QB1, are turned off.

The second voltage VSS is also supplied to the first gate line GL1 and second stage ST12 via the turned-on seventh switching element Tr107.

In the fifth period T5, the first stage ST11 is disabled, the second stage ST12 outputs the first scan pulse Vout2, and the third stage ST13 is enabled.

Operations in the sixth period T6 will be described.

In the sixth period T6, only the fourth clock pulse CLK4 is maintained in a low-level state, whereas the remaining clock pulses are maintained in a high-level state, as shown in FIG. 5. The stages ST21 to ST2n of the second shift register 201b are still maintained in a disabled state in the sixth period T6 because the second start pulse VST2 is still maintained in a high-level state.

Operations in the seventh period T7 will be described.

In the seventh period T7, only the fifth clock pulse CLK5 is maintained in a low-level state, whereas the remaining clock pulses are maintained in a high-level state, as shown in FIG. 5.

The fifth clock pulse CLK5 output in the seventh period T7 is supplied to the second switching element Tr202 in the third stage ST13 of the first shift register 201a. For example, the fifth clock pulse CLK5 is supplied to the source terminal of the second switching element Tr202. The second switching element Tr202, which is connected, at the gate terminal thereof, to the first node Q2 of the third stage ST13, is maintained in an ON state because the first node Q2 has been changed to a low-level state in the fifth period T5. In the seventh period T7, the fifth clock pulse CLK5 is supplied, as the first scan pulse Vout3, to the third gate line GL3 via the turned-on second switching element Tr202. The fifth clock pulse CLK5 is also supplied, as a start pulse, to the fourth stage ST14 of the first shift register 201a via the turned-on second switching element Tr202. The first node Q2 of the fourth stage ST14 is maintained in a low-level state in the seventh period T7. For example, the fourth stage ST14 is enabled.

The fifth clock pulse CLK5 output in the seventh period T7 is also supplied to the fourth switching element Tr204 in the second stage ST12 of the first shift register 201a. For example, the fifth clock pulse CLK5 is supplied to the gate terminal of the fourth switching element Tr204. The fourth switching element Tr204 is turned on, thereby causing the first voltage VDD to be supplied to the second node QB2 of the second stage ST12 via the turned-on fourth switching element Tr204. Accordingly, the second node QB2 is maintained in a low-level state. Thus, the fifth and sixth switching elements Tr205 and Tr206, each of which is connected, at the gate terminal thereof, to the second node QB2, are turned on.

The second voltage VSS is supplied to the first node Q2 via the turned-on fifth switching element Tr205. Accordingly, the first node Q2 is maintained in a high-level state, so that the second and third switching elements Tr202 and Tr203, each of which is connected, at the gate terminal thereof, to the first node Q2, are turned off.

The second voltage VSS is also supplied to the second gate line GL2 and third stage ST13 via the turned-on sixth switching element Tr206.

In the seventh period T7, the second stage ST12 is disabled, the third stage ST13 outputs the first scan pulse Vout3, and the fourth stage ST14 is enabled.

Operations in the eighth period T8 will be described.

In the eighth period T8, only the sixth clock pulse CLK6 is maintained in a low-level state, whereas the remaining clock pulses are maintained in a high-level state, as shown in FIG. 5. The stages ST21 to ST2n of the second shift register 201b are still maintained in a disabled state in the eighth period T8 because the second start pulse VST2 is maintained in a high-level state.

Operations in the ninth period T9 will be described.

In the ninth period T9, only the seventh clock pulse CLK7 is maintained in a low-level state, whereas the remaining clock pulses are maintained in a high-level state, as shown in FIG. 5.

The seventh clock pulse CLK7 is supplied to the second switching element Tr102 in the first stage ST11 of the first shift register 201a. For example, the seventh clock pulse CLK7 is supplied to the gate terminal of the second switching element Tr102. Accordingly, the second switching element Tr102 is turned on. The first stage ST11 does not output the first scan pulse Vout1 in the ninth period T9 because the first stage ST11 is in a disabled state.

In the ninth period T9, the seventh clock pulse CLK7 is also supplied to the second switching element Tr202 in the fourth stage ST14 of the first shift register 201a. For example, the seventh clock pulse CLK7 is supplied to the source terminal of the second switching element Tr202. Accordingly, in the above-described manner, the fourth stage ST14 supplies the seventh clock pulse CLK7 to the fourth gate line GL4 as the first scan pulse Vout4, and to the fifth stage ST15 of the first shift register 201a as a start pulse.

The fifth through n-th stages ST15 to ST1n of the first shift register 201a sequentially output first scan pulses in the above-described manner in the remaining periods, namely, in the tenth through k-th periods, respectively. The second start pulse VST2 may be output in one of the second through k-th periods. From the point of time when the second start pulse VST2 is output, the stages ST21 to ST2n of the second shift register 201b sequentially output the second scan pulses Vout1' to Voutn', respectively. It is assumed that the point of time when the second start pulse VST2 is output corresponds to the tenth period T10.

Since the second start pulse VST2 is output later than the first start pulse VST1, the point of time when each of the stages ST11 to ST1n in the first shift register 201a scans an associated one of the gate lines GL1 to GLn is different from the point of time when each of the stages ST21 to ST2n in the second shift register 201b scans an associated one of the gate lines GL1 to GLn.

Operations in the tenth period T10 will be described.

In the tenth period T10, only the second start pulse VST2 and eighth clock pulse CLK8 are maintained in a low-level state, whereas the remaining clock pulses are maintained in a high-level state, as shown in FIG. 5.

The second start pulse VST2 and eighth clock pulse CLK8 are supplied to the first stage ST21 of the second shift register 201a. The second start pulse VST2 is input to the gate terminals of the first and eighth switching elements Tr101' and Tr108' in the first stage ST21, whereas the eighth clock pulse CLK8 is supplied to the gate terminal of the second switching element Tr102' in the first stage ST21.

The first switching element Tr101' is turned on. The second start pulse VST2 is applied to the first node Q1' via the turned-on first switching element Tr101'. Thus, the first node Q1' is maintained in a low-level state. As a result, the third and fourth switching elements Tr103' and Tr104' are turned on, each of which is connected, at the gate terminal thereof, to the first node Q1'. In the tenth period T10, the gate and drain terminals of the third switching element Tr103' are connected to each other via the capacitor C2.

The eighth switching element Tr108' is turned on by the second start pulse VST2. As a result, the second voltage VSS is supplied to the second node QB1' via the turned-on eighth switching element Tr108'. Accordingly, the second node QB1' is maintained in a high-level state by the second voltage VSS. Thus, the sixth and seventh switching elements Tr106' and Tr107' are turned off, each of which is connected, at the gate terminal thereof, to the second node QB1'.

The second start pulse VST2 output in the tenth period T10 is also supplied to the first stage ST11 of the first shift register 201a. For example, the second start pulse VST2 is supplied to the gate terminal of the ninth switching element Tr109 in the first stage ST11, thereby causing the ninth switching element Tr109 to be turned on. The second voltage VSS is supplied to the second node QB1 of the first stage ST11 via the turned-on ninth switching element Tr109. Thus, the second node QB1 of the first stage ST11 of the first shift register 201a is maintained in a high-level state in the tenth period T10. Accordingly, the sixth and seventh switching elements Tr106 and Tr107 are turned off, each of which is connected, at the gate terminal thereof, to the second node QB1. Since the remaining clock pulses other than the second start pulse VST2 and eighth clock pulse CLK8 are maintained in a high-level state in the tenth period T10, as described above, the first node Q1 of the first stage ST11 of the first shift register 201a is also maintained in a high-level state.

During the tenth period T10, both the first and second nodes Q1 and QB1 in the first stage ST11 of the first shift register 201a are maintained in a high-level state. Accordingly, no output from the first stage ST11 of the first shift register 201a is generated. For example, in the tenth period T10, the first stage ST11 of the first shift register 201a is floated from the first gate line GL1.

In the tenth period T10, the first stage ST11 of the first shift register 201a is floated from the first gate line GL1, whereas the first stage ST21 of the second shift register 201b is enabled.

Operations in the eleventh period T11 will be described.

In the eleventh period T11, the first clock pulse CLK1 is again output, as shown in FIG. 5. For example, in the eleventh period T11, only the first clock pulse CLK1 is maintained in a low-level state, whereas the remaining clock pulses are maintained in a high-level state.

In the eleventh period T11, in the above-described manner, the fifth stage ST15 of the first shift register 201a outputs a first scan pulse to the fifth gate line GL5, the fourth stage ST14 arranged directly upstream from the fifth stage ST15 is disabled, and the sixth stage ST16 arranged directly downstream from the fifth stage ST15 is enabled.

Operations in the twelfth period T12 will be described.

In the twelfth period T12, only the second clock pulse CLK2 is maintained in a low-level state, whereas the remaining clock pulses are maintained in a high-level state, as shown in FIG. 5.

The second clock pulse CLK2 is supplied to the third switching element Tr103' in the first stage ST21 of the second shift register 201b. For example, the second clock pulse CLK2 is supplied to the source terminal of the third switching element Tr103'. In the above-described manner, the third switching element Tr103' supplies the second clock pulse CLK2 to the first gate line GL1 as the second scan pulse Vout1', and to the second stage ST22 as a start pulse.

The second scan pulse Vout1' supplied to the first gate line GL1 turns on the switching elements TrS of the pixel cells PXL connected to the first gate line GL1. An OFF voltage from the first data line DL1 is supplied to the gate terminal of the drive switching elements TrD via the turned-on switching elements TrS, respectively. Accordingly, the light emitting elements OLED respectively connected to the drive switching elements TrD are prevented from emitting light because the drive switching elements TrD are turned off by the OFF voltage.

The second scan pulse Vout1' output from the first stage ST21 of the second shift register 201b is supplied to the second stage ST12 of the first shift register 201a via the first gate line GL1. For example, the second scan pulse Vout1' is supplied to the gate terminal of the seventh switching element Tr207, thereby turning on the seventh switching element Tr207. As a result, the second voltage VSS is supplied to the second node QB2 of the second stage ST12 via the turned-on seventh switching element Tr207. Accordingly, the second node QB2 of the second stage ST12 is changed to a high-level state. Thus, the fifth and sixth switching elements Tr205 and Tr206, each of which is connected, at the gate terminal thereof, to the second node QB2, are turned off. In the twelfth period T12, both the first and second nodes Q2 and QB2 in the second stage ST12 of the first shift register 201a are maintained in a high-level state. During the twelfth period T12, accordingly, the second stage ST12 of the first shift register 201a is floated from the second gate line GL2.

The first stage ST11 of the first shift register 201a is floated from the first gate line GL1 by the second start pulse VST2, whereas the second through n-th stages ST12 to ST1n of the first shift register 201a are floated from the associated gate lines by the associated second scan pulses from the first through n−1-th stages of the second shift register 201b, respectively.

In the luminescent display device, the first and second shift registers 201a and 201b may be driven using 6 clock pulses.

Another embodiment of the first and second shift registers 201a and 201b included in the luminescent display device will be described in detail.

Figure 7:
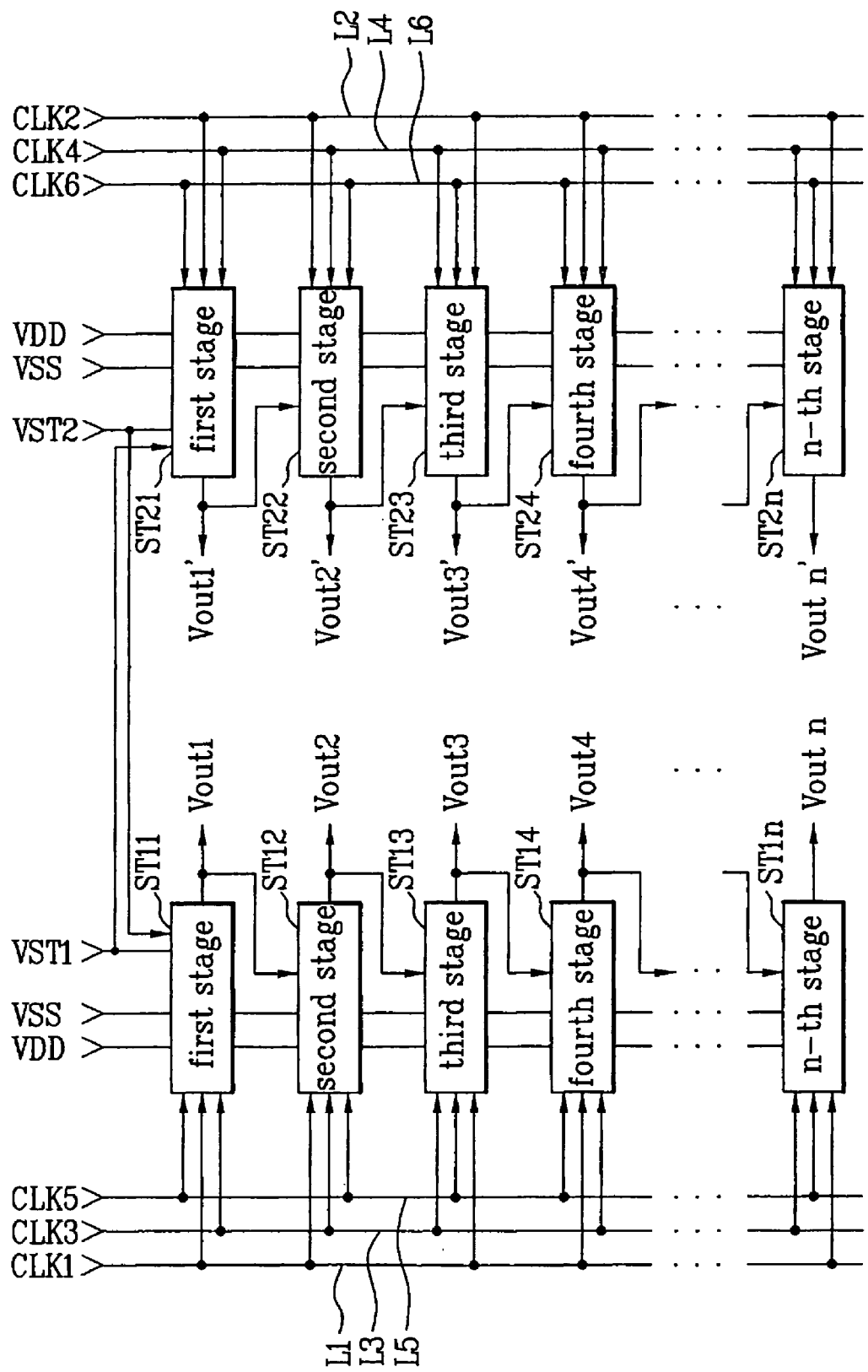
FIG. 7 is a block diagram that illustrates configurations of the first and second shift registers different from those of FIG. 2.
Figure 8:
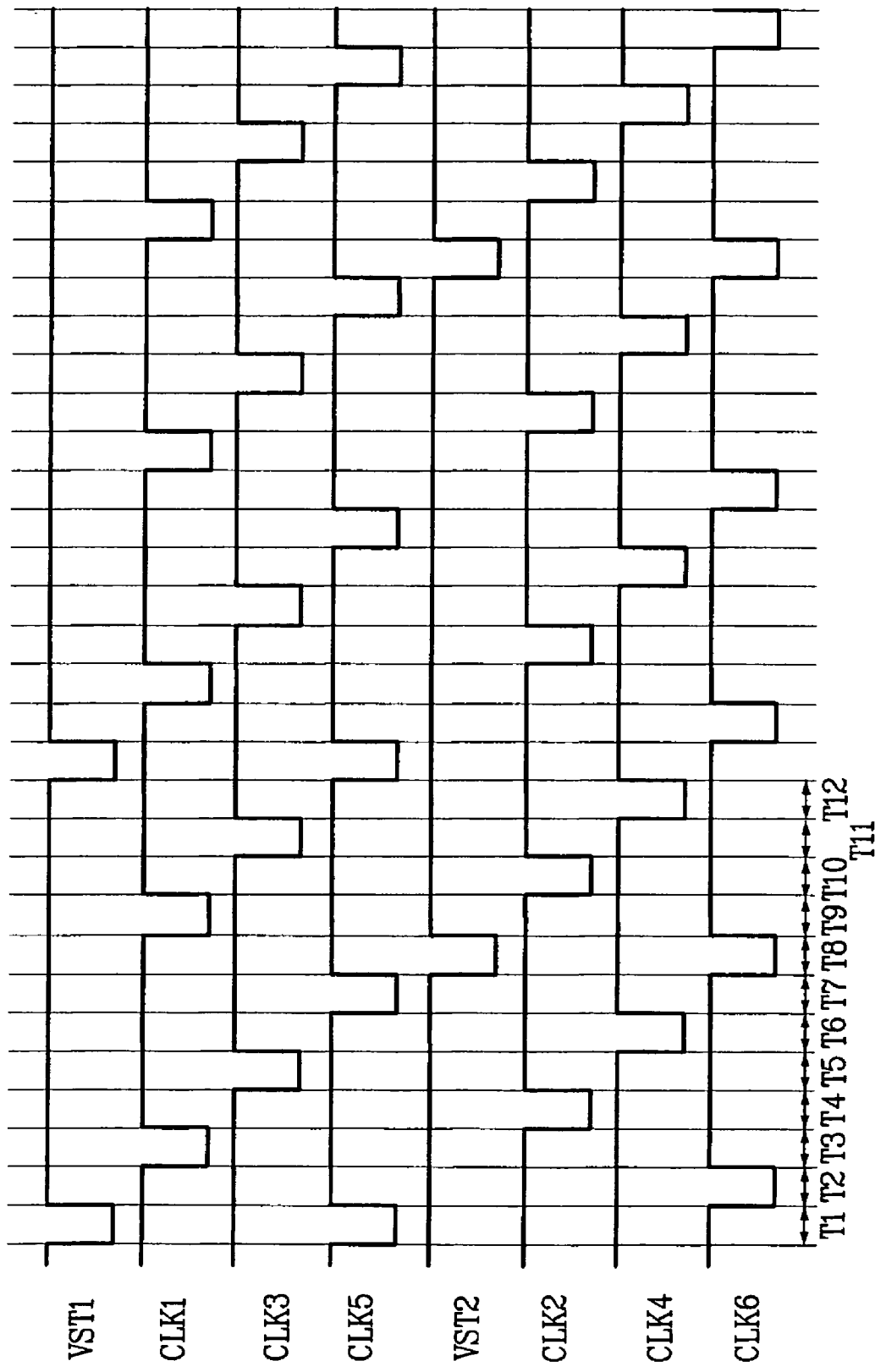
FIG. 8 is a timing diagram of various signals supplied to the first and second shift registers shown in FIG. 7.

FIG. 7 is a block diagram that illustrates configurations of the first and second shift registers different from those of FIG. 2. FIG. 8 is a timing diagram of various signals supplied to the first and second shift registers shown in FIG. 7.

As shown in FIG. 7, the first shift register 201a includes a plurality of stages ST11 to ST1n. Each of the stages ST11 to ST1n receives the first, third, and fifth clock pulses CLK1, CLK3, and CLK5, and the first and second voltages VDD and VSS. In addition to the three clock pulses, the first stage ST11, which outputs a first scan pulse, namely, the first scan pulse Vout1, earlier than the remaining stages ST12 to ST1n in each subfield, receives the first and second start pulses VST1 and VST2.

The second shift register 201b includes a plurality of stages ST21 to ST2n, as shown in FIG. 7, which is similar to the first shift register 201a. Each of the stages ST21 to ST2n receives the second, fourth, and sixth clock pulses CLK2, CLK4, and CLK6, and the first and second voltages VDD and VSS. In addition to the three clock pulses, the first stage ST21, which outputs a second scan pulse, namely, the second scan pulse Vout1', earlier than the remaining stages ST22 to ST2n in each subfield, receives the first and second start pulses VST1 and VST2.

As shown in FIG. 8, the first through sixth clock pulses CLK1 to CLK6 are sequentially and circularly output. The first start pulse VST1 is synchronous with the fifth clock pulse CLK5, and the second start pulse VST2 is synchronous with the sixth clock pulse CLK6.

The configuration and operation of each of the stages ST11 to ST1n and ST21 to ST2n in this embodiment are identical to those of the above-described embodiment.

Each of the first and second shift registers 201a and 201b is a 3-phase shift register that is driven using three clock pulses sequentially output in a circulated manner. The stages ST11 to ST1n and ST21 to ST2n of each of the first and second shift registers 201a and 201b are driven on the basis of 3 stages.

The order of the clock pulses input to the stages ST11 to ST1n included in the first shift register 201a will be described.

The first stage ST11 is first enabled by the fifth clock pulse CLK5 input to the first stage ST11. The first stage ST11 then receives the first clock pulse CLK1 output next to the fifth clock pulse CLK5, and outputs the received first clock pulse CLK1 as the first scan pulse Vout1. The first stage ST11 is disabled by the third clock pulse CLK3 input to the first stage ST11 next to the first clock pulse CLK1.

The second stage ST12 is first enabled by the first clock pulse CLK1 input to the second stage ST12. The second stage ST12 then receives the third clock pulse CLK3 output next to the first clock pulse CLK1, and outputs the received third clock pulse CLK3 as the first scan pulse Vout2. The second stage ST12 is disabled by the fifth clock pulse CLK5 input to the second stage ST12 next to the third clock pulse CLK3.

The third stage ST13 is first enabled by the third clock pulse CLK3 input to the third stage ST13. The third stage ST13 then receives the fifth clock pulse CLK5 output next to the third clock pulse CLK3, and outputs the received fifth clock pulse CLK5 as the first scan pulse Vout3. The third stage ST13 is disabled by the first clock pulse CLK1 input to the third stage ST13 next to the fifth clock pulse CLK5.

The fourth through n-th stages ST14 to ST1n receive clock pulses in the same order as the clock pulses supplied to the first through third stages ST11 to ST13, respectively. For example, the fourth stage ST14 receives the fifth, first, and third clock pulses CLK5, CLK1, and CLK3 supplied to the first stage ST11. The fifth stage ST15 receives the first, third, and fifth clock pulses CLK1, CLK3, and CLK5 supplied to the second stage ST12. The sixth stage ST16 receives the third, fifth, and first clock pulses CLK3, CLK5, and CLK1 supplied to the third stage ST13.

During an enabling operation each of the stages ST11 to ST1n receives the first scan pulse from the upstream stage, in addition to the clock pulses input in the enabling operation. The first scan pulses Vout1 to Voutn output from the stages ST11 to ST1n are synchronous with the clock pulses supplied in the enabling operation of the stages ST11 to ST1n, respectively. Since there is no stage arranged upstream from the first stage ST11, the first stage ST11 is enabled by the first start pulse VST1 supplied from the timing controller and the clock pulse synchronous with the first start pulse VST1, namely, the fifth clock pulse CLK5.

The order of the clock pulses input to the stages ST21 to ST2n included in the second shift register 201b will be described.

The first stage ST21 is first enabled by the sixth clock pulse CLK6 input to the first stage ST21. The first stage ST21 then receives the second clock pulse CLK2 output next to the sixth clock pulse CLK6, and outputs the received second clock pulse CLK2 as the second scan pulse Vout1'. The first stage ST21 is disabled by the fourth clock pulse CLK4 input to the first stage ST21 next to the second clock pulse CLK2.

The second stage ST22 is first enabled by the second clock pulse CLK2 input to the second stage ST22. The second stage ST22 then receives the fourth clock pulse CLK4 output next to the second clock pulse CLK2, and outputs the received fourth clock pulse CLK4 as the second scan pulse Vout2'. The second stage ST22 is disabled by the sixth clock pulse CLK6 input to the second stage ST22 next to the fourth clock pulse CLK4.

The third stage ST23 is first enabled by the fourth clock pulse CLK4 input to the third stage ST23. The third stage ST23 then receives the sixth clock pulse CLK6 output next to the fourth clock pulse CLK4, and outputs the received sixth clock pulse CLK6 as the second scan pulse Vout3'. The third stage ST23 is disabled by the second clock pulse CLK2 input to the third stage ST23 next to the sixth clock pulse CLK6.

The fourth through n-th stages ST24 to ST2n receive clock pulses in the same order as the clock pulses supplied to the first through third stages ST21 to ST23, respectively. For example, the fourth stage ST24 receives the sixth, second, and fourth clock pulses CLK6, CLK2, and CLK4 supplied to the first stage ST21. The fifth stage ST25 receives the second, fourth, and sixth clock pulses CLK2, CLK4, and CLK6 supplied to the second stage ST22. The sixth stage ST26 receives the fourth, sixth, and second clock pulses CLK4, CLK6, and CLK2 supplied to the third stage ST23.

During an enabling operation each of the stages ST21 to ST2n receives the second scan pulse from the upstream stage, in addition to the clock pulses input in the enabling operation. The second scan pulses Vout1' to Voutn' output from the stages ST21 to ST2n are synchronous with the clock pulses supplied in the enabling operation of the stages ST21 to ST2n, respectively. Since there is no stage arranged upstream from the first stage ST21, the first stage ST21 is enabled by the second start pulse VST2 supplied from the timing controller and the clock pulse synchronous with the second start pulse VST2, namely, the sixth clock pulse CLK6.

Figure 9:
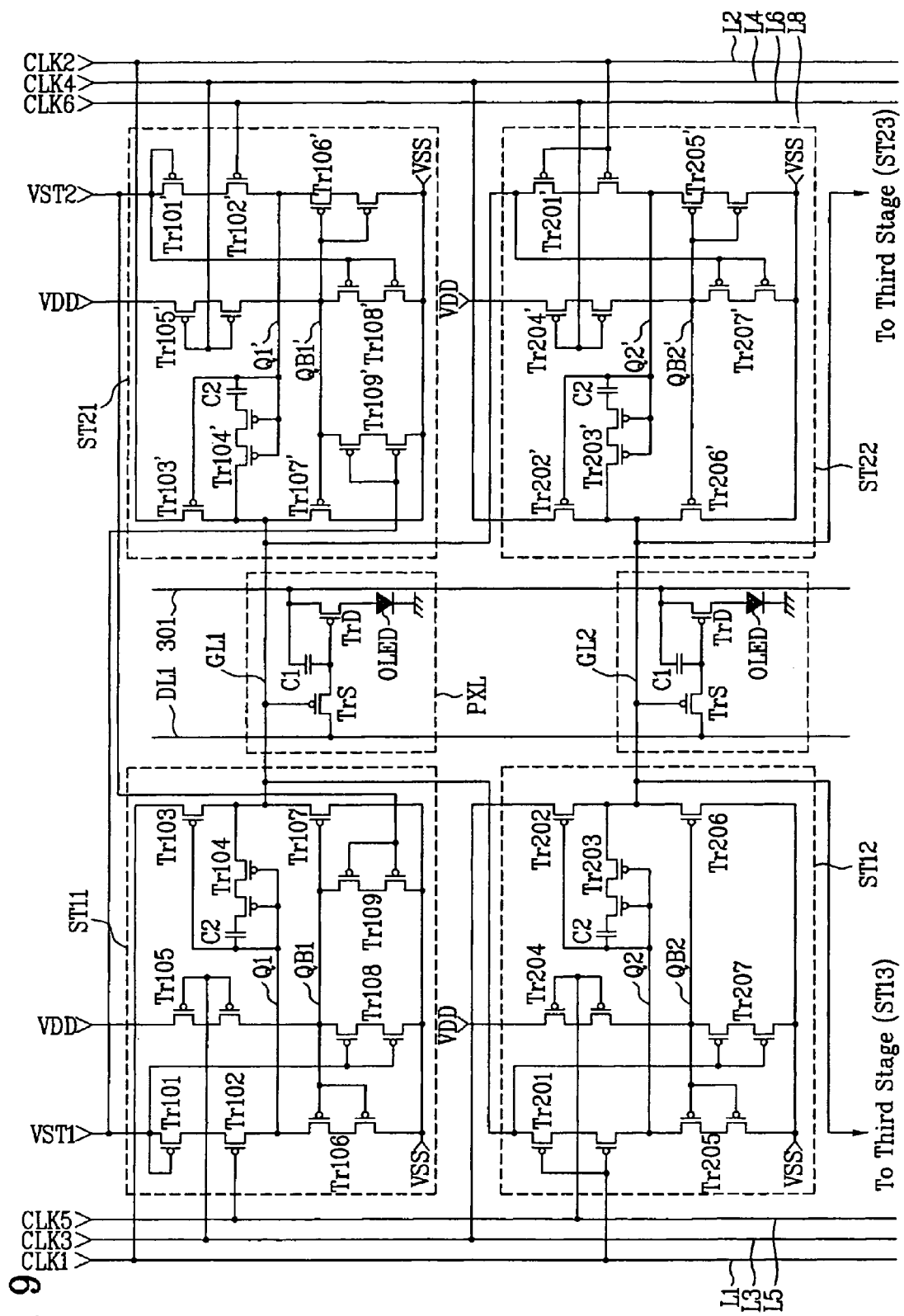
FIG. 9 is a circuit diagram that illustrates detailed configurations of the stages included in the first and second shift registers shown in FIG. 7.

FIG. 9 is a circuit diagram that illustrates detailed configurations of the stages included in the first and second shift registers shown in FIG. 7.

The first stage ST11 included in the first shift register 201a will be described.

As shown in FIG. 9, the first stage ST11 includes first through ninth switching elements Tr101 to Tr109, and a capacitor C2. Since the first through ninth switching elements Tr101 to Tr109, and capacitor C2 are identical to those of FIG. 6, no description thereof will be given.

Each of the second through n-th stages ST12 to ST1n includes first through seventh switching elements Tr201 to Tr207, and a capacitor C2, as shown in FIG. 9. Since the first through seventh switching elements Tr201 to Tr207, and capacitor C2 are identical to those of FIG. 6, no description thereof will be given.

The configuration of the stages ST21 to ST2n included in the second shift register 201b will be described in detail.

As shown in FIG. 9, the first stage ST21 includes first through ninth switching elements Tr101' to Tr109', and a capacitor C2. Since the first through ninth switching elements Tr101' to Tr109', and capacitor C2 are identical to those of FIG. 6, no description thereof will be given.

Each of the second through n-th stages ST22 to ST2n includes first through seventh switching elements Tr201' to Tr207', and a capacitor C2, as shown in FIG. 9. Since the first through seventh switching elements Tr201' to Tr207', and capacitor C2 are identical to those of FIG. 6, no description thereof will be given.

Since the operations of the first and second shift registers 201a and 201b having the above-described configurations are identical to those of FIG. 6, no further description thereof will be given.

In the luminescent display device, the first and second shift registers 201a and 201b thereof may be driven using two clock pulses.

Another embodiment of the first and second shift registers 201a and 201b will be described in detail.

Figure 10:
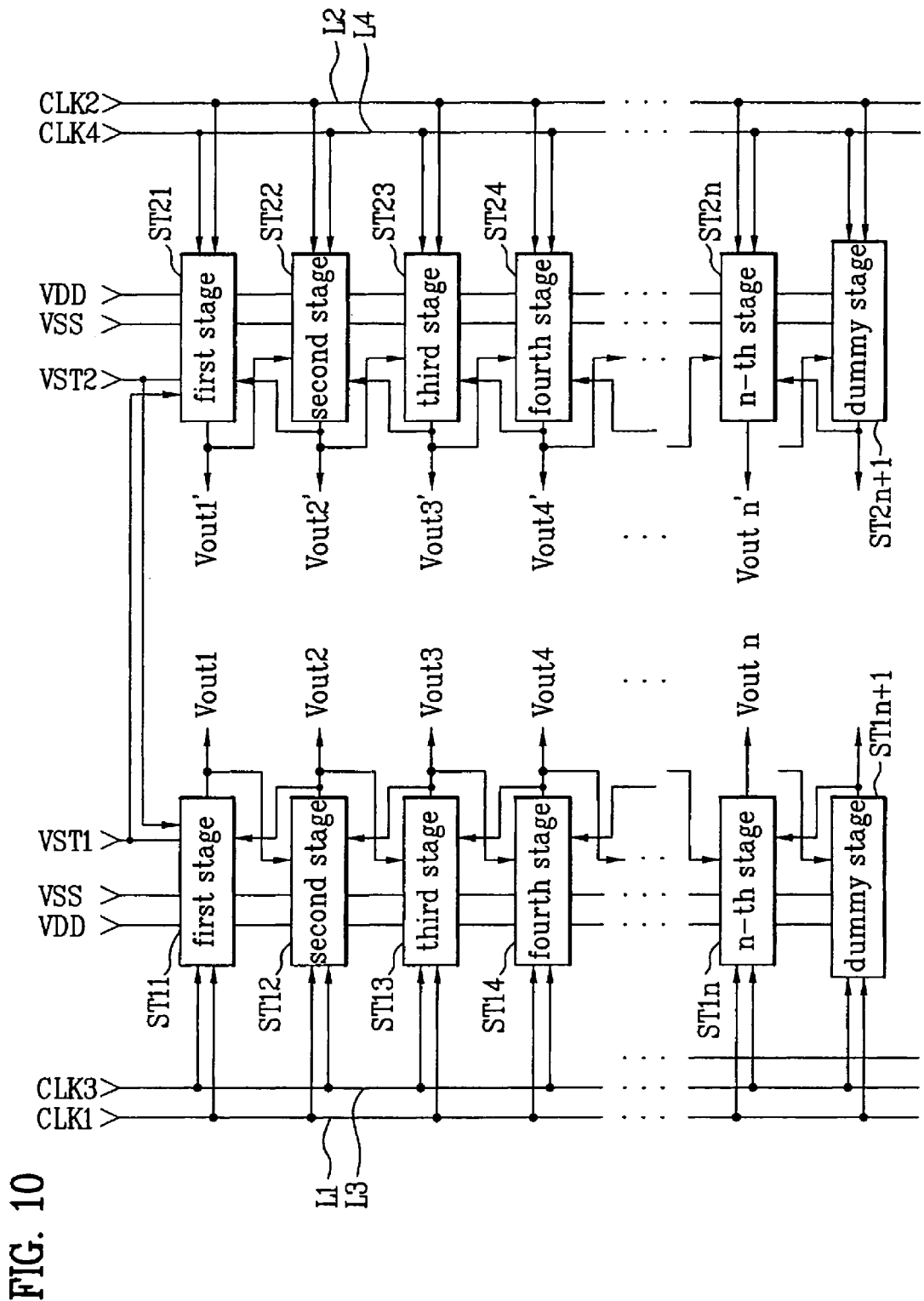
FIG. 10 is a block diagram that illustrates configurations of the first and second shift registers different from those of FIG. 2.
Figure 11:
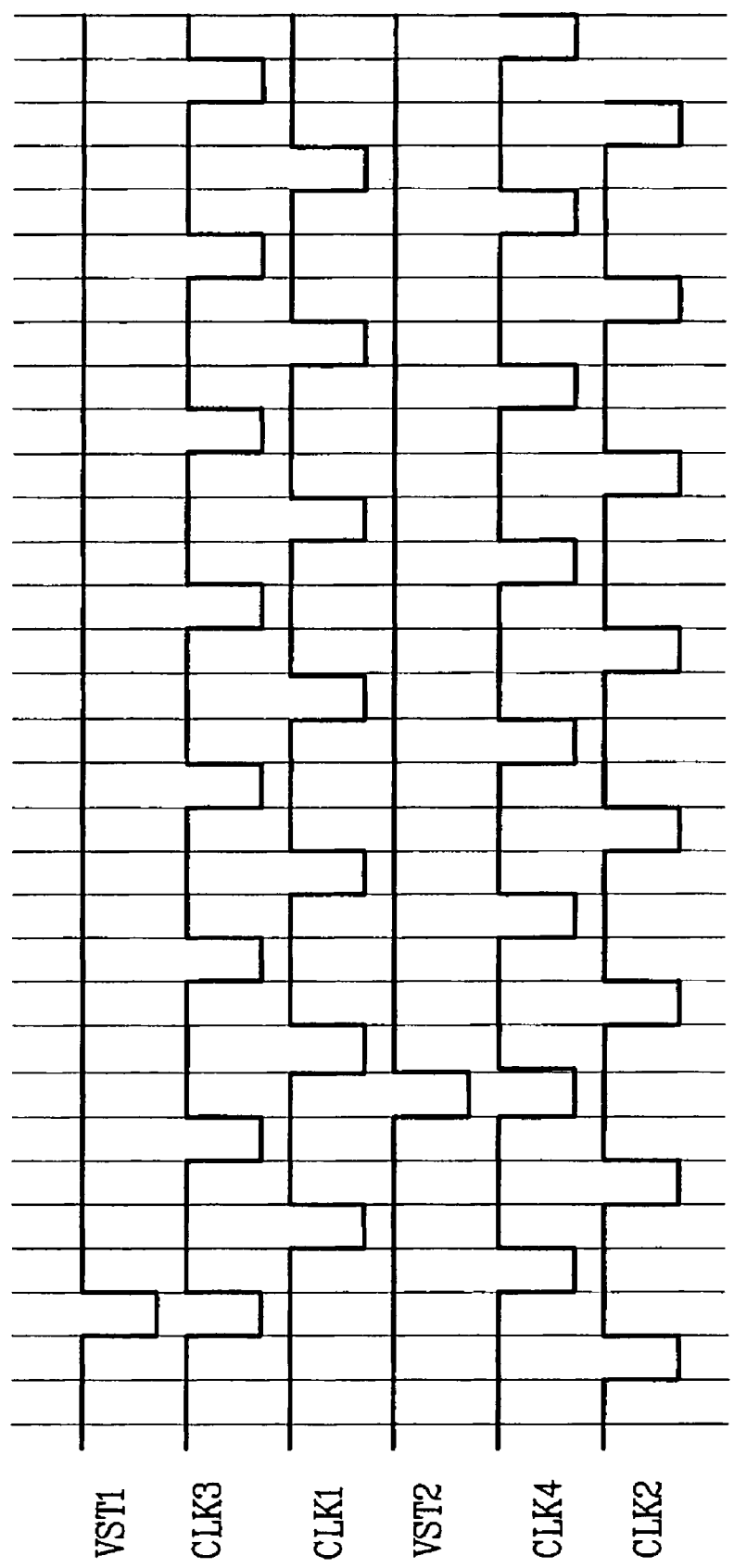
FIG. 11 is a timing diagram of various signals supplied to the first and second shift registers shown in FIG. 10.

FIG. 10 is a block diagram that illustrates configurations of the first and second shift registers different from those of FIG. 2. FIG. 11 is a timing diagram of various signals supplied to the first and second shift registers shown in FIG. 10.

As shown in FIG. 10, the first shift register 201a includes a plurality of stages ST11 to ST1n, and a dummy stage ST1n+1. Each of the stages ST11 to ST1n and dummy stage ST1n+1 receives the first and third clock pulses CLK1 and CLK3, and the first and second voltages VDD and VSS. In addition to the two clock pulses CLK1 and CLK3, the first stage ST11, which outputs a first scan pulse, for example, the first scan pulse Vout1, earlier than the remaining stages ST12 to ST1n in each subfield, receives the first and second start pulses VST1 and VST2.

The second shift register 201b includes a plurality of stages ST21 to ST2n, which is similar to the first shift register 201a, and a dummy stage ST2n+1, as shown in FIG. 10. Each of the stages ST21 to ST2n receives the second and fourth clock pulses CLK2 and CLK4, and the first and second voltages VDD and VSS. In addition to the two clock pulses CLK2 and CLK4, the first stage ST21, which outputs a second scan pulse, namely, the second scan pulse Vout1', earlier than the remaining stages ST22 to ST2n in each subfield, receives the first and second start pulses VST1 and VST2.

As shown in FIG. 11, the first through fourth clock pulses CLK1 to CLK4 are sequentially and circularly output. The first start pulse VST1 is synchronous with the third clock pulse CLK3, and the second start pulse VST2 is synchronous with the fourth clock pulse CLK4.

The configuration and operation of each of the stages ST11 to ST1n and ST21 to ST2n, and dummy stage ST2n+1 in this embodiment are identical to those of the above-described embodiment.

Each of the first and shift registers 201a and 201b is a 2-phase shift register which is driven using two clock pulses sequentially output in a circulated manner. Accordingly, the stages ST11 to ST1n and ST21 to ST2n of each of the first and second shift registers 201a and 201b are driven on the basis of 2 stages.

The order of the clock pulses input to the stages ST11 to ST1n included in the first shift register 201a will be described.

The first stage ST11 is first enabled by the third clock pulse CLK3 input to the first stage ST11. The first stage ST11 then receives the first clock pulse CLK1 output next to the third clock pulse CLK3, and outputs the received first clock pulse CLK1 as the first scan pulse Vout1.

The second stage ST12 is first enabled by the first clock pulse CLK1 input to the second stage ST12. The second stage ST12 then receives the third clock pulse CLK3 output next to the first clock pulse CLK1, and outputs the received third clock pulse CLK3 as the first scan pulse Vout2.

The third through n-th stages ST13 to ST1n receive clock pulses in the same order as the clock pulses supplied to the first and second stages ST11 and ST12, respectively. For example, the third stage ST13 receives the third and first clock pulses CLK3 and CLK1 supplied to the first stage ST11. The fourth stage ST14 receives the first and third clock pulses CLK1 and CLK3 supplied to the second stage ST12.

During an enabling operation each of the stages ST11 to ST1n receives the first scan pulse from the upstream stage, in addition to the clock pulses input in the enabling operation. The first scan pulses Vout1 to Voutn output from the stages ST11 to ST1n are synchronous with the clock pulses supplied in the enabling operation of the stages ST11 to ST1n, respectively. Since there is no stage arranged upstream from the first stage ST11, the first stage ST11 is enabled by the first start pulse VST1 supplied from the timing controller and the clock pulse synchronous with the first start pulse VST1, namely, the third clock pulse CLK3.

Each of the stages ST11 to ST1n is disabled by the first scan pulse supplied thereto from the downstream stage.

The dummy stage ST1n+1 is a stage that disables the n-th stage ST1n. The dummy stage ST1n+1 is not connected to any gate lines, but is connected to the n-th stage ST1n. For example, the dummy stage ST1n+1 supplies a first dummy scan pulse Voutn+1 to the n-th stage ST1n, to disable the n-th stage ST1n.

The order of the clock pulses input to the stages ST21 to ST2n included in the second shift register 201b will be described.

The first stage ST21 is first enabled by the fourth clock pulse CLK4 input to the first stage ST21. The first stage ST21 then receives the second clock pulse CLK2 output next to the fourth clock pulse CLK4, and outputs the received second clock pulse CLK2 as the second scan pulse Vout1'.

The second stage ST22 is first enabled by the second clock pulse CLK2 input to the second stage ST22. The second stage ST22 then receives the fourth clock pulse CLK4 output next to the second clock pulse CLK2, and outputs the received fourth clock pulse CLK4 as the second scan pulse Vout2'.

The third through n-th stages ST23 to ST2n receive clock pulses in the same order as the clock pulses supplied to the first and second stages ST21 and ST22, respectively. For example, the third stage ST23 receives the fourth and second clock pulses CLK4 and CLK2 supplied to the first stage ST21. The fourth stage ST24 receives the second and fourth clock pulses CLK2 and CLK4 supplied to the second stage ST22.

During an enabling operation each of the stages ST21 to ST2n receives the second scan pulse from the upstream stage, in addition to the clock pulses input in the enabling operation. The second scan pulses Vout1' to Voutn' output from the stages ST21 to ST2n are synchronous with the clock pulses supplied in the enabling operation of the stages ST21 to ST2n, respectively. Since there is no stage arranged upstream from the first stage ST21, the first stage ST21 is enabled by the second start pulse VST2 supplied from the timing controller and the clock pulse synchronous with the second start pulse VST2, namely, the fourth clock pulse CLK4.

Each of the stages ST21 to ST2n is disabled by the second scan pulse supplied thereto from the downstream stage.

The dummy stage ST2n+1 is a stage that disables the n-th stage ST2n. The dummy stage ST2n+1 is not connected to any gate lines, but is connected to the n-th stage ST2n. For example, the dummy stage ST2n+1 supplies a second dummy scan pulse Voutn+1' to the n-th stage ST2n, to disable the n-th stage ST2n.

The configurations of the above-described stages ST11 to ST1n+1 and ST21 to ST2n+1 will be described.

Figure 12:
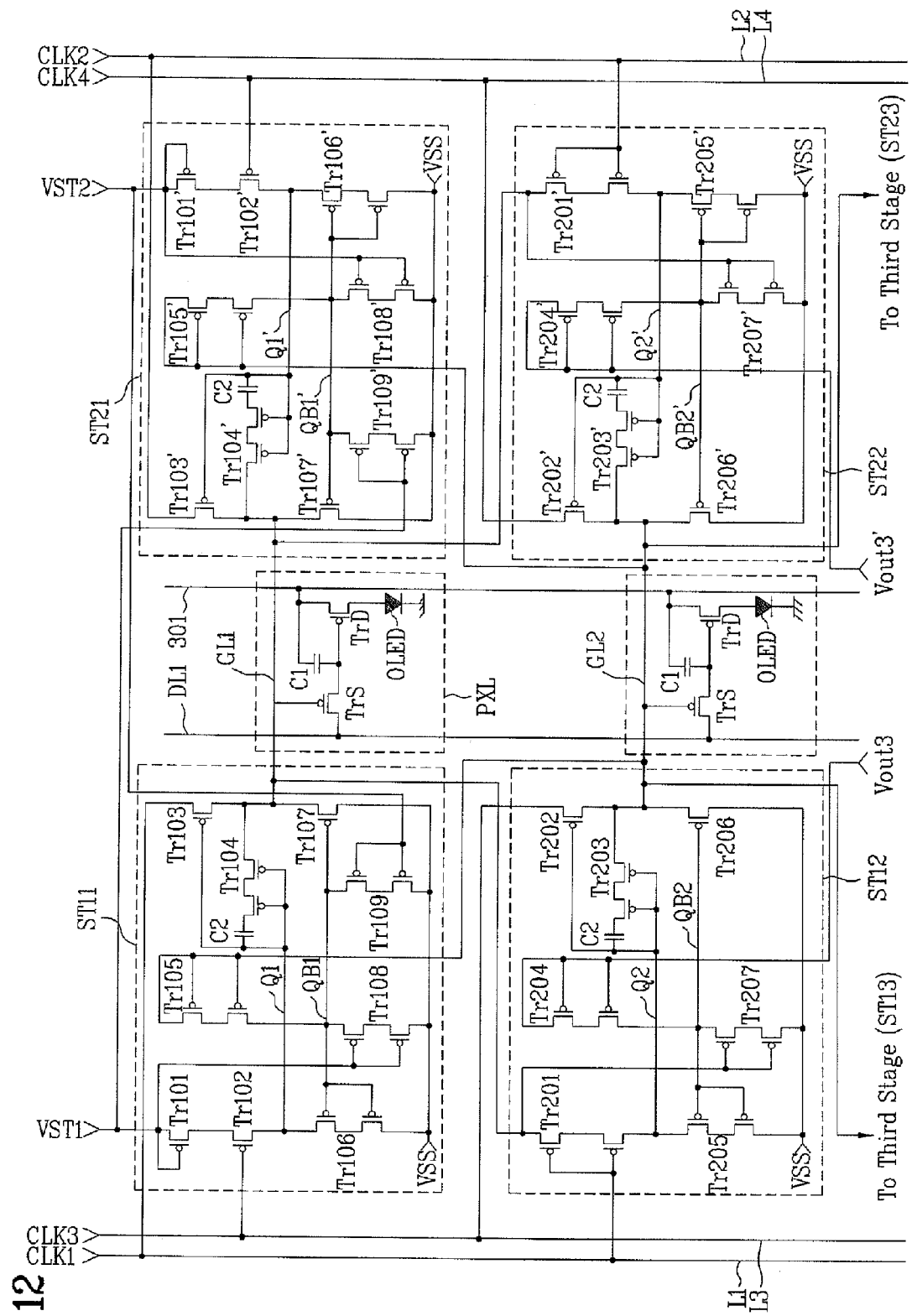
FIG. 12 is a circuit diagram that illustrates detailed configurations of the stages included in the first and second shift registers shown in FIG. 10.

FIG. 12 is a circuit diagram that illustrates detailed configurations of the stages included in the first and second shift registers shown in FIG. 10.

The first stage ST11 included in the first shift register 201a will be described.

As shown in FIG. 12, the first stage ST11 includes first through ninth switching elements Tr101 to Tr109, and a capacitor C2. Since the first through ninth switching elements Tr101 to Tr109, and capacitor C2 shown in FIG. 12 are identical to those of FIG. 6, no description thereof will be given.

The fifth switching element Tr105 of the first stage ST11 receives, at the gate and source terminals thereof, a first scan pulse Vout2 supplied from the downstream stage (namely, the second stage ST12), as shown in FIG. 12. The fifth switching element Tr105 supplies the first scan pulse Vout2 from the downstream stage to the second node QB1 in response to the first scan pulse Vout2.

Each of the second through n-th stages ST12 to ST1n and dummy stage ST1n+1 includes first through seventh switching elements Tr201 to Tr207, and a capacitor C2, as shown in FIG. 12. Since the first through seventh switching elements Tr201 to Tr207, and capacitor C2 are identical to those of FIG. 6, no description thereof will be given.

The fourth switching element Tr204 of each of the second through n-th stages ST12 to ST1n receives, at the gate and source terminals thereof, a first scan pulse supplied from the downstream stage, as shown in FIG. 12. The fourth switching element Tr204 supplies the first scan pulse from the downstream stage to the second node QB2 in response to the first scan pulse.

The configurations of the stages ST21 to ST2n and dummy stage ST2n+1 included in the second shift register 201b will be described in detail.

As shown in FIG. 12, the first stage ST21 includes first through ninth switching elements Tr101' to Tr109', and a capacitor C2. Since the first through ninth switching elements Tr101' to Tr109', and capacitor C2 shown in FIG. 12 are identical to those of FIG. 6, no description thereof will be given.

The fifth switching element Tr105' of the first stage ST21 receives, at the gate and source terminals thereof, a first scan pulse Vout2' supplied from the downstream stage (namely, the second stage ST22). The fifth switching element Tr105' supplies the first scan pulse Vout2' from the downstream stage to the second node QB1' in response to the first scan pulse Vout2'.

Each of the second through n-th stages ST22 to ST2n and dummy stage ST2n+1 includes first through seventh switching elements Tr201' to Tr207', and a capacitor C2, as shown in FIG. 12. Since the first through seventh switching elements Tr201' to Tr207', and capacitor C2 are identical to those of FIG. 6, no description thereof will be given.

The fourth switching element Tr204' of each of the second through n-th stages ST22 to ST2n receives, at the gate and source terminals thereof, a first scan pulse supplied from the downstream stage, as shown in FIG. 12. The fourth switching element Tr204' supplies the first scan pulse from the downstream stage to the second node QB2' in response to the first scan pulse.

Since the operations of the first and second shift registers 201a and 201b are identical to those of FIG. 6, no further description thereof will be given.

As described above, in the luminescent display device, each pixel cell thereof is driven using the above-described first and second shift registers 201a and 201b. By virtue of the configurations of the first and second shift registers 201a and 201b, each pixel cell PXL can use only two switching elements TrS and TrD, and one capacitor C1. The luminescent display device can achieve an increase in the aspect ratio of pixel regions.

It will be apparent to those skilled in the art that various modifications and variations can be made in the present embodiments without departing from the spirit or scope of the claimed arrangments. Thus, it is intended that the present embodiments cover the modifications and variations provided they come within the scope of the appended claims and their equivalents.

As apparent from the above description, the luminescent display apparatus according to the present invention includes a first shift register connected to one end of each gate line, and a second shift register connected to the other end of each gate line. The first and second shift registers sequentially scan each gate line, to drive one gate line two times in each subfield period.

In accordance with such configurations of the first and second shift registers, each pixel cell can include only two switching elements and one capacitor. Accordingly, it is possible to increase the aspect ratio of each pixel region.

What is claimed is:
1. A luminescent display device that comprises:
a display that includes a plurality of gate lines and a plurality of data lines that extend orthogonally to the gate lines;
a first shift register connected to one end of each of the gate lines, and adapted to sequentially supply first scan pulses to the gate lines;

a second shift register connected to the other end of each of the gate lines, and adapted to sequentially supply second scan pulses to the gate lines, wherein an output time of the first scan pulse to be supplied to a one gate line is different from an output time of the second scan pulse to be supplied to the one gate line, and wherein the period of time between the point of time when the first scan pulse is output and the point of time when the second scan pulse is output corresponds to one subfield period;

switching elements adapted to switch an ON voltage or an OFF voltage from one of the data lines in accordance with the first scan pulse from one of the gate lines, and to switch an OFF voltage from the associated data line in accordance with the second scan pulse from the associated gate line;

drive switching elements adapted to generate current in accordance with the ON voltage from an associated one of the switching elements, wherein the drive switching elements are turned off in accordance with the OFF voltage from the associated switching element;

capacitors connected between gate and source terminals of one of the drive switching elements; and light emitting elements adapted to emit light in accordance with the current from an associated one of the drive switching elements;

wherein the first shift register includes a plurality of stages that supply a first scan pulse to an end of one of the gate lines;

wherein the second shift register includes a plurality of stages that supply a second scan pulse to an end of one of the gate lines;

wherein a first one of the stages included in the first shift register includes:

first, third, fifth, and seventh clock transfer lines that transfer the first, third, fifth, and seventh ones of the first through eighth clock pulses output in a sequential manner;

first and second power lines that transfer first and second voltages that have different polarities;

a first switching element that responds to a first start pulse synchronous with the seventh clock pulse, the first switching element that outputs the first start pulse in response to the first start pulse;

a second switching element that supplies the first start pulse output from the first switching element in response to the seventh clock pulse from the seventh clock transfer line;

a third switching element that outputs the first clock pulse from the first clock transfer line as a first scan pulse in response to the first start pulse supplied to the first node, and supplies the first scan pulse to one end of the associated gate line and to the downstream stage;

a capacitor connected to the first node at one terminal of the capacitor;

a fourth switching element that connects the other end of the capacitor and one end of the associated gate line in response to the first start pulse supplied to the first node;

a fifth switching element that supplies the first voltage to a second node in response to the third clock pulse from the third clock transfer line;

a sixth switching element that supplies the second voltage to the first node in response to the first voltage supplied to the second node, to turn off the third and fourth switching elements;

a seventh switching element that supplies the second voltage to one end of the associated gate line and to the downstream stage in response to the first voltage supplied to the second node;

an eighth switching element that supplies the second voltage to the second node in response to the first start pulse, to turn off the sixth and seventh switching elements; and a ninth switching element that supplies the second voltage to the second node in response to a second start pulse synchronous with the eighth clock pulse, to turn off the sixth and seventh switching elements.

2. The luminescent display device according to claim 1, wherein the second, fourth, fifth, sixth, eighth, and ninth switching elements are dual switching elements that include two switching elements connected in series.

3. The luminescent display device according to claim 1, wherein each of the remaining stages of the first shift register, except for the first stage, includes:

first, third, fifth, and seventh clock transfer lines that transfer first, third, fifth, and seventh ones of the first through eighth clock pulses;

first and second power lines that transfer the first and second voltages;

a first switching element that supplies a first scan pulse from the upstream stage to a first node in response to the first clock pulse synchronous with the first scan pulse from the upstream stage;

a second switching element that outputs the third clock pulse from the third clock transfer line as a first scan pulse in response to the first scan pulse supplied to the first node, and supplies the first scan pulse to one end of the associated gate line and to the downstream stage;

a capacitor connected to the first node at one terminal of the capacitor;

a third switching element that connects the other end of the capacitor and one end of the associated gate line in response to the first scan pulse supplied to the first node;

a fourth switching element that supplies the first voltage to a second node in response to the fifth clock pulse from the fifth clock transfer line;

a fifth switching element that supplies the second voltage to the first node in response to the first voltage supplied to the second node, to turn off the second and third switching elements;

a sixth switching element that supplies the second voltage to one end of the associated gate line and to the downstream stage in response to the first voltage supplied to the second node; and a seventh switching element that supplies the second voltage to the second node in response to the first scan pulse from the upstream stage, to turn off the fifth and sixth switching elements.

4. The luminescent display device according to claim 3, wherein the first, third, fourth, fifth, and seventh switching elements are dual switching elements that include two switching elements connected in series.

5. The luminescent display device according to claim 1, wherein a first one of the stages included in the second shift register includes:

second, fourth, sixth, and eighth clock transfer lines that transfer second, fourth, sixth, and eighth ones of the first through eighth clock pulses;

first and second power lines that transfer the first and second voltages;

a first switching element that responds to the second start pulse synchronous with the eighth clock pulse, the first switching element that outputs the second start pulse in response to the second start pulse;
a second switching element that supplies the second start pulse output from the first switching element in response to the eighth clock pulse from the eighth clock transfer line;
a third switching element that outputs the second clock pulse from the second clock transfer line as a second scan pulse in response to the second start pulse supplied to the first node, and supplies the second scan pulse to the other end of the associated gate line and to the downstream stage;
a capacitor connected to the first node at one terminal of the capacitor;
a fourth switching element that connects the other end of the capacitor and the other end of the associated gate line in response to the second start pulse supplied to the first node;
a fifth switching element that supplies the first voltage to a second node in response to the fourth clock pulse from the fourth clock transfer line;
a sixth switching element that supplies the second voltage to the first node in response to the first voltage supplied to the second node, to turn off the third and fourth switching elements;
a seventh switching element that supplies the second voltage to the other end of the associated gate line and to the downstream stage in response to the first voltage supplied to the second node;
an eighth switching element that supplies the second voltage to the second node in response to the second start pulse, to turn off the sixth and seventh switching elements; and
a ninth switching element that supplies the second voltage to the second node in response to the first start pulse synchronous with the seventh clock pulse, to turn off the sixth and seventh switching elements.

6. The luminescent display device according to claim 5, wherein the second, fourth, fifth, sixth, eighth, and ninth switching elements are dual switching elements that include two switching elements connected in series.

7. The luminescent display device according to claim 5, wherein each of the remaining stages of the second shift register, except for the first stage, includes:
second, fourth, sixth, and eighth clock transfer lines that transfer the second, fourth, sixth, and eighth ones of the first through eighth clock pulses;
first and second power lines that transfer the first and second voltages;
a first switching element that supplies a second scan pulse from the upstream stage to a first node in response to the second clock pulse that is synchronous with the second scan pulse from the upstream stage;
a second switching element that outputs the fourth clock pulse from the fourth clock transfer line as a second scan pulse in response to the second scan pulse supplied to the first node, and supplies the second scan pulse to the other end of the associated gate line and to the downstream stage;
a capacitor connected to the first node at one terminal of the capacitor;
a third switching element that connects the other end of the capacitor and the other end of the associated gate line in response to the second scan pulse supplied to the first node;
a fourth switching element that supplies the first voltage to a second node in response to the sixth clock pulse from the sixth clock transfer line;
a fifth switching element that supplies the second voltage to the first node in response to the first voltage supplied to the second node, to turn off the second and third switching elements;
a sixth switching element that supplies the second voltage to the other end of the associated gate line and to the downstream stage in response to the first voltage supplied to the second node; and
a seventh switching element that supplies the second voltage to the second node in response to the second scan pulse from the upstream stage, to turn off the fifth and sixth switching elements.

8. The luminescent display device according to claim 7, wherein the first, third, fourth, fifth, and seventh switching elements are dual switching elements that include two switching elements connected in series.

9. A luminescent display device that comprises:
a display that includes a plurality of gate lines and a plurality of data lines that extend orthogonally to the gate lines;
a first shift register connected to one end of each of the gate lines, and adapted to sequentially supply first scan pulses to the gate lines;
a second shift register connected to the other end of each of the gate lines, and adapted to sequentially supply second scan pulses to the gate lines, wherein an output time of the first scan pulse to be supplied to a one gate line is different from an output time of the second scan pulse to be supplied to the one gate line, and wherein the period of time between the point of time when the first scan pulse is output and the point of time when the second scan pulse is output corresponds to one subfield period;
switching elements adapted to switch an ON voltage or an OFF voltage from one of the data lines in accordance with the first scan pulse from one of the gate lines, and to switch an OFF voltage from the associated data line in accordance with the second scan pulse from the associated gate line;
drive switching elements adapted to generate current in accordance with the ON voltage from an associated one of the switching elements, wherein the drive switching elements are turned off in accordance with the OFF voltage from the associated switching element;
capacitors connected between gate and source terminals of one of the drive switching elements; and
light emitting elements adapted to emit light in accordance with the current from an associated one of the drive switching elements;
wherein the first shift register includes a plurality of stages that supply a first scan pulse to an end of one of the gate lines;
wherein the second shift register includes a plurality of stages that supply a second scan pulse to an end of one of the gate lines;
wherein a first one of the stages included in the first shift register includes:
first, third, and fifth clock transfer lines that transfer first, third, and fifth ones of first through sixth clock pulses output in a sequential manner;
first and second power lines that transfer first and second voltages that have different polarities;
a first switching element that responds to a first start pulse that is synchronous with the fifth clock pulse, the first switching element outputs the first start pulse in response to the first start pulse;

a second switching element that supplies the first start pulse output from the first switching element in response to the fifth clock pulse from the fifth clock transfer line;

a third switching element that outputs the first clock pulse from the first clock transfer line as a first scan pulse in response to the first start pulse supplied to the first node, and supplies the first scan pulse to one end of the associated gate line and to the downstream stage;

a capacitor connected to the first node at one terminal of the capacitor;

a fourth switching element that connects the other end of the capacitor and one end of the associated gate line in response to the first start pulse supplied to the first node;

a fifth switching element that supplies the first voltage to a second node in response to the third clock pulse from the third clock transfer line;

a sixth switching element that supplies the second voltage to the first node in response to the first voltage supplied to the second node, to turn off the third and fourth switching elements;

a seventh switching element that supplies the second voltage to one end of the associated gate line and to the downstream stage in response to the first voltage supplied to the second node;

an eighth switching element that supplies the second voltage to the second node in response to the first start pulse, to turn off the sixth and seventh switching elements; and a ninth switching element that supplies the second voltage to the second node in response to a second start pulse synchronous with the sixth clock pulse, to turn off the sixth and seventh switching elements.

10. The luminescent display device according to claim 9, wherein the second, fourth, fifth, sixth, eighth, and ninth switching elements are dual switching elements including two switching elements connected in series.

11. The luminescent display device according to claim 9, wherein each of the remaining stages of the first shift register, except for the first stage, includes:

first, third, and fifth clock transfer lines that transfer first, third, and fifth ones of the first through sixth clock pulses;

first and second power lines that transfer the first and second voltages;

a first switching element that supplies a first scan pulse from the upstream stage to a first node in response to the first clock pulse synchronous with the first scan pulse from the upstream stage;

a second switching element that outputs the third clock pulse from the third clock transfer line as a first scan pulse in response to the first scan pulse supplied to the first node, and supplies the first scan pulse to one end of the associated gate line and to the downstream stage;

a capacitor connected to the first node at one terminal of the capacitor;

a third switching element that connects the other end of the capacitor and one end of the associated gate line in response to the first scan pulse supplied to the first node;

a fourth switching element that supplies the first voltage to a second node in response to the fifth clock pulse from the fifth clock transfer line;

a fifth switching element that supplies the second voltage to the first node in response to the first voltage supplied to the second node, to turn off the second and third switching elements;

a sixth switching element that supplies the second voltage to one end of the associated gate line and to the downstream stage in response to the first voltage supplied to the second node; and a seventh switching element that supplies the second voltage to the second node in response to the first scan pulse from the upstream stage, to turn off the fifth and sixth switching elements.

12. The luminescent display device according to claim 11, wherein the first, third, fourth, fifth, and seventh switching elements are dual switching elements that include two switching elements connected in series.

13. The luminescent display device according to claim 9, wherein a first one of the stages included in the second shift register includes:

second, fourth, and sixth clock transfer lines that transfer second, fourth, and sixth ones of the first through sixth ones of the first through sixth clock pulses;

first and second power lines that transfer the first and second voltages;

first and second power lines that transfer first and second voltages that have different polarities;

a first switching element that responds to the second start pulse synchronous with the sixth clock pulse, the first switching element that outputs the second start pulse in response to the second start pulse;

a second switching element that supplies the second start pulse output from the first switching element in response to the sixth clock pulse from the sixth clock transfer line;

a third switching element that outputs the second clock pulse from the second clock transfer line as a second scan pulse in response to the second start pulse supplied to the first node, and supplies the second scan pulse to the other end of the associated gate line and to the downstream stage;

a capacitor connected to the first node at one terminal of the capacitor;

a fourth switching element that connects the other end of the capacitor and the other end of the associated gate line in response to the second start pulse supplied to the first node;

a fifth switching element that supplies the first voltage to a second node in response to the fourth clock pulse from the fourth clock transfer line;

a sixth switching element that supplies the second voltage to the first node in response to the first voltage supplied to the second node, to turn off the third and fourth switching elements;

a seventh switching element that supplies the second voltage to the other end of the associated gate line and to the downstream stage in response to the first voltage supplied to the second node;

an eighth switching element that supplies the second voltage to the second node in response to the second start pulse, to turn off the sixth and seventh switching elements; and a ninth switching element that supplies the second voltage to the second node in response to the first start pulse synchronous with the fifth clock pulse, to turn off the sixth and seventh switching elements.

14. The luminescent display device according to claim 13, wherein each of the second, fourth, fifth, sixth, eighth, and ninth switching elements are dual switching elements that include two switching elements connected in series.

15. The luminescent display device according to claim 13, wherein the remaining stages of the second shift register, except for the first stage, includes:
second, fourth, and sixth clock transfer lines that transfer the second, fourth, and sixth ones of the first through sixth clock pulses;
first and second power lines that transfer the first and second voltages;
a first switching element that supplies a second scan pulse from the upstream stage to a first node in response to the second clock pulse synchronous with the second scan pulse from the upstream stage;
a second switching element that outputs the fourth clock pulse from the fourth clock transfer line as a second scan pulse in response to the second scan pulse supplied to the first node, and supplies the second scan pulse to the other end of the associated gate line and to the downstream stage;
a capacitor connected to the first node at one terminal of the capacitor;
a third switching element that connects the other end of the capacitor and the other end of the associated gate line in response to the second scan pulse supplied to the first node;
a fourth switching element that supplies the first voltage to a second node in response to the sixth clock pulse from the sixth clock transfer line;
a fifth switching element that supplies the second voltage to the first node in response to the first voltage supplied to the second node, to turn off the second and third switching elements;
a sixth switching element that supplies the second voltage to the other end of the associated gate line and to the downstream stage in response to the first voltage supplied to the second node; and
a seventh switching element that supplies the second voltage to the second node in response to the second scan pulse from the upstream stage, to turn off the fifth and sixth switching elements.

16. The luminescent display device according to claim 15, wherein the first, third, fourth, fifth, and seventh switching elements are dual switching elements that include two switching elements connected in series.

17. A luminescent display device that comprises:
a display that includes a plurality of gate lines and a plurality of data lines that extend orthogonally to the gate lines;
a first shift register connected to one end of each of the gate lines, and adapted to sequentially supply first scan pulses to the gate lines;
a second shift register connected to the other end of each of the gate lines, and adapted to sequentially supply second scan pulses to the gate lines, wherein an output time of the first scan pulse to be supplied to a one gate line is different from an output time of the second scan pulse to be supplied to the one gate line, and wherein the period of time between the point of time when the first scan pulse is output and the point of time when the second scan pulse is output corresponds to one subfield period;
switching elements adapted to switch an ON voltage or an OFF voltage from one of the data lines in accordance with the first scan pulse from one of the gate lines, and to switch an OFF voltage from the associated data line in accordance with the second scan pulse from the associated gate line;
drive switching elements adapted to generate current in accordance with the ON voltage from an associated one of the switching elements, wherein the drive switching elements are turned off in accordance with the OFF voltage from the associated switching element;
capacitors connected between gate and source terminals of one of the drive switching elements; and
light emitting elements adapted to emit light in accordance with the current from an associated one of the drive switching elements;
wherein the first shift register includes a plurality of stages that supply a first scan pulse to an end of one of the gate lines;
wherein the second shift register includes a plurality of stages that supply a second scan pulse to an end of one of the gate lines;
wherein a first one of the stages included in the first shift register includes:
first and third clock transfer lines that transfer first and third ones of first through fourth clock pulses output in a sequential manner;
first and second power lines that transfer first and second voltages that have different polarities;
a first switching element that responds to a first start pulse synchronous with the third clock pulse, the first switching element that outputs the first start pulse in response to the first start pulse;
a second switching element that supplies, to a first node, the first start pulse output from the first switching element in response to the third clock pulse from the third clock transfer line;
a third switching element that outputs the first clock pulse from the first clock transfer line as a first scan pulse in response to the first start pulse supplied to the first node, and supplies the first scan pulse to one end of the associated gate line and to the downstream stage;
a capacitor connected to the first node at one terminal of the capacitor;
a fourth switching element that connects the other end of the capacitor and one end of the associated gate line in response to the first start pulse supplied to the first node;
a fifth switching element that supplies the first scan pulse to a second node in response to the first clock pulse from the downstream stage;
a sixth switching element that supplies the second voltage to the first node in response to the first voltage supplied to the second node, to turn off the third and fourth switching elements;
a seventh switching element that supplies the second voltage to one end of the associated gate line and to the downstream stage in response to the first voltage supplied to the second node;
an eighth switching element that supplies the second voltage to the second node in response to the first start pulse, to turn off the sixth and seventh switching elements; and
a ninth switching element that supplies the second voltage to the second node in response to a second start pulse synchronous with the fourth clock pulse, to turn off the sixth and seventh switching elements.

18. The luminescent display device according to claim 17, wherein the second, fourth, fifth, sixth, eighth, and ninth switching elements are dual switching elements that include two switching elements connected in series.

19. The luminescent display device according to claim 17, wherein each of the remaining stages of the first shift register, except for the first stage, includes:

first and third clock transfer lines that transfer first and third ones of the first through fourth clock pulses;

first and second power lines that transfer the first and second voltages;

a first switching element that supply a first scan pulse from the upstream stage to a first node in response to the first clock pulse synchronous with the first scan pulse from the upstream stage;

a second switching element that outputs the third clock pulse from the third clock transfer line as a first scan pulse in response to the first scan pulse that is supplied to the first node, and supplies the first scan pulse to one end of the associated gate line and to the downstream stage;

a capacitor connected to the first node at one terminal of the capacitor;

a third switching element that connects the other end of the capacitor and one end of the associated gate line in response to the first scan pulse that is supplied to the first node;

a fourth switching element that supplies the first scan pulse to a second node in response to the first scan pulse from the downstream stage;

a fifth switching element that supplies the second voltage to the first node in response to the first scan pulse supplied to the second node, to turn off the second and third switching elements;

a sixth switching element that supplies the second voltage to one end of the associated gate line and to the downstream stage in response to the first scan pulse supplied to the second node; and a seventh switching element that supplies the second voltage to the second node in response to the first scan pulse from the upstream stage, to turn off the fifth and sixth switching elements.

20. The luminescent display device according to claim 19, wherein the first, third, fourth, fifth, and seventh switching elements are dual switching elements that include two switching elements connected in series.

21. The luminescent display device according to claim 17, wherein a first one of the stages included in the second shift register includes:

second and fourth clock transfer lines that transfer second and fourth ones of the first through fourth clock pulses;

first and second power lines that transfer the first and second voltages;

a first switching element that responds to the second start pulse synchronous with the fourth clock pulse, the first switching element that outputs the second start pulse in response to the second start pulse;

a second switching element that supplies the second start pulse output from the first switching element in response to the fourth clock pulse from the fourth clock transfer line;

a third switching element that outputs the second clock pulse from the second clock transfer line as a second scan pulse in response to the second start pulse supplied to the first node, and supplies the second scan pulse to the other end of the associated gate line and to the downstream stage;

a capacitor connected to the first node at one terminal of the capacitor;

a fourth switching element that connects the other end of the capacitor and the other end of the associated gate line in response to the second start pulse supplied to the first node;

a fifth switching element that supplies the second scan pulse to a second node in response to the first scan pulse from the downstream stage;

a sixth switching element that supplies the second voltage to the first node in response to the second scan pulse supplied to the second node, to turn off the third and fourth switching elements;

a seventh switching element that supplies the second voltage to the other end of the associated gate line and to the downstream stage in response to the second scan pulse supplied to the second node;

an eighth switching element that supplies the second voltage to the second node in response to the second start pulse, to turn off the sixth and seventh switching elements; and a ninth switching element that supplies the second voltage to the second node in response to the first start pulse synchronous with the third clock pulse, to turn off the sixth and seventh switching elements.

22. The luminescent display device according to claim 21, wherein the second, fourth, fifth, sixth, eighth, and ninth switching elements are dual switching elements that include two switching elements connected in series.

23. The luminescent display device according to claim 21, wherein each of the remaining stages of the second shift register, except for the first stage, includes:

second and fourth clock transfer lines that transfer the second and fourth ones of the first through fourth clock pulses;

first and second power lines that transfer the first and second voltages;

a first switching element that supplies a second scan pulse from the upstream stage to a first node in response to the second clock pulse synchronous with the second scan pulse from the upstream stage;

a second switching element that outputs the fourth clock pulse from the fourth clock transfer line as a second scan pulse in response to the second scan pulse supplied to the first node, and supplies the second scan pulse to the other end of the associated gate line and to the downstream stage;

a capacitor connected to the first node at one terminal of the capacitor;

a third switching element that connects the other end of the capacitor and the other end of the associated gate line in response to the second scan pulse supplied to the first node;

a fourth switching element that supplies the second scan pulse to a second node in response to the second scan pulse from the downstream stage;

a fifth switching element that supplies the second voltage to the first node in response to the second scan pulse supplied to the second node, to turn off the second and third switching elements;

a sixth switching element that supplies the second voltage to the other end of the associated gate line and to the downstream stage in response to the second scan pulse supplied to the second node; and a seventh switching element that supplies the second voltage to the second node in response to the second scan pulse from the upstream stage, to turn off the fifth and sixth switching elements.

24. The luminescent display device according to claim 23, wherein the first, third, fourth, fifth, and seventh switching elements are dual switching elements that include two switching elements connected in series.

25. A method that drives a luminescent display device including a plurality of gate lines and a plurality of data lines that extend orthogonally to the gate lines, switching elements adapted to switch an ON voltage or an OFF voltage from an associated one of the data lines in accordance with a scan pulse from an associated one of the gate lines, and to switch an OFF voltage from the associated data line in accordance with the second scan pulse from the associated gate line, drive switching elements that supply current in accordance with the ON voltage from an associated one of the switching elements, and cut off the supply of current in accordance with the OFF voltage from the associated switching element, and light emitting elements adapted to emit light in accordance with the current from an associated one of the drive switching elements, the method comprises the acts of:

supplying a first scan pulse to the gate lines using a first shift register;

supplying the ON voltage to the data line associated with the gate line;

supplying a second scan pulse to the gate line using a second shift register, wherein an output time of the first scan pulse to be supplied to a one gate line is different from an output time of the second scan pulse to be supplied to the one gate line, and wherein the period of time between the point of time when the first scan pulse is output and the point of time when the second scan pulse is output corresponds to one subfield period; and supplying the OFF voltage to the associated data;

wherein the first shift register includes a plurality of stages that supply the first scan pulse to an end of one of the gate lines;

wherein the second shift register includes a plurality of stages that supply the second scan pulse to an end of one of the gate lines;

wherein a first one of the stages included in the first shift register includes:

first, third, fifth, and seventh clock transfer lines that transfer the first, third, fifth, and seventh one of first through eight clock pulses output in a sequential manner;

first and second power lines that transfer first and second voltages that have different polarities;

a first switching element that responds to a first start pulse synchronous with the seventh clock pulse, the first switching element that outputs the first start pulse in response to the first start pulse;

a second switching element that supplies the first start pulse output from the first switching element in response to the seventh clock pulse from the seventh clock transfer line;

a third switching element that outputs the first clock pulse from the first clock transfer line as a first scan pulse in response to the first start pulse supplied to the first node, and supplies the first scan pulse to one end of the associated gate line and to the downstream stage;

a capacitor connected to the first node at one terminal of the capacitor;

a fourth switching element that connects the other end of the capacitor and one end of the associated gate line in response to the first start pulse supplied to the first node:

a fifth switching element that supplies the first voltage to a second node in response to the third clock pulse from the third clock transfer line;

a sixth switching element that supplies the second voltage to the first node in response to the first voltage supplied to the second node, to turn off the third and fourth switching elements;

a seventh switching element that supplies the second voltage to one end of the associated gate line and to the downstream stage in response to the first voltage supplied to the second node;

an eighth switching element that supplies the second voltage to the second node in response to the first start pulse, to turn off the sixth and seventh switching elements; and a ninth switching element that supplies the second voltage to the second node in response to a second start pulse synchronous with the eighth clock pulse, to turn off the sixth and seventh switching elements.

26. The method according to claim 25, wherein the act of supplying the first scan pulse to the gate lines primarily turns on the switching element associated with the gate line.

27. The method according to claim 25, wherein the act of supplying a second scan pulse to the gate line turns on the associated switching element.

* * * * *

UNITED STATES PATENT AND TRADEMARK OFFICE
CERTIFICATE OF CORRECTION

PATENT NO. : 7,907,104 B2  
APPLICATION NO. : 11/472841  
DATED : March 15, 2011  
INVENTOR(S) : Du Hwan Oh et al.

Page 1 of 1

It is certified that error appears in the above-identified patent and that said Letters Patent is hereby corrected as shown below:

In the Claims

In column 33, claim 1, line 37, after "and seventh ones of" delete "the".

In column 43, claim 25, line 28, after "OFF voltage to the associated" replace "data;" with --data line;--.

Signed and Sealed this  
Seventeenth Day of May, 2011

David J. Kappos  
*Director of the United States Patent and Trademark Office*